United States Patent
Han et al.

(10) Patent No.: US 8,835,909 B2
(45) Date of Patent: *Sep. 16, 2014

(54) HYBRID DIELECTRIC MATERIAL FOR THIN FILM TRANSISTORS

(75) Inventors: Lin Han, Princeton, NJ (US); Prashant Mandlik, Lawrenceville, NJ (US); Sigurd Wagner, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 272 days.

This patent is subject to a terminal disclaimer.

(21) Appl. No.: 13/056,704

(22) PCT Filed: Jul. 30, 2009

(86) PCT No.: PCT/US2009/052233
§ 371 (c)(1),
(2), (4) Date: Mar. 16, 2011

(87) PCT Pub. No.: WO2010/017088
PCT Pub. Date: Feb. 11, 2010

(65) Prior Publication Data
US 2011/0180789 A1   Jul. 28, 2011

Related U.S. Application Data

(60) Provisional application No. 61/086,047, filed on Aug. 4, 2008.

(51) Int. Cl.
| | | |
|---|---|---|
| H01L 29/08 | (2006.01) | |
| H01L 21/02 | (2006.01) | |
| H01L 29/66 | (2006.01) | |
| H01L 29/49 | (2006.01) | |
| C23C 16/40 | (2006.01) | |
| H01L 21/316 | (2006.01) | |

(52) U.S. Cl.
CPC ...... *H01L 29/4908* (2013.01); *H01L 21/02216* (2013.01); *H01L 21/02304* (2013.01); *H01L 29/66765* (2013.01); *H01L 21/02126* (2013.01); *C23C 16/401* (2013.01); *H01L 21/31633* (2013.01); *H01L 21/02274* (2013.01)
USPC ............... 257/40; 257/66; 257/291; 257/292; 257/655; 257/E51.007; 257/E51.018; 257/E51.027; 438/149; 438/725; 438/770

(58) Field of Classification Search
None
See application file for complete search history.

(56) References Cited

U.S. PATENT DOCUMENTS

| | | |
|---|---|---|
| 5,041,088 A | 8/1991 | Ritson et al. |
| 6,281,138 B1 | 8/2001 | Brady et al. |

(Continued)

FOREIGN PATENT DOCUMENTS

| | | |
|---|---|---|
| EP | 1445793 | 8/2004 |
| EP | 1834933 | 9/2007 |

(Continued)

OTHER PUBLICATIONS

PCT International Search Report and Written Opinion for PCT/US09/052233 mailed on Nov. 16, 2009.

(Continued)

*Primary Examiner* — Su Kim
(74) *Attorney, Agent, or Firm* — Morgan, Lewis & Bockius LLP

(57) ABSTRACT

Thin-film transistors are made using an organosilicate glass (OSG) as an insulator material. The organosilicate glasses may be $SiO_2$-silicone hybrid materials deposited by plasma-enhanced chemical vapor deposition from siloxanes and oxygen. These hybrid materials may be employed as the gate dielectric, as a subbing layer, and/or as a back channel passivating layer. The transistors may be made in any conventional TFT geometry.

22 Claims, 16 Drawing Sheets

(56) References Cited

U.S. PATENT DOCUMENTS

| | | | |
|---|---|---|---|
| 6,440,876 | B1 | 8/2002 | Wang et al. |
| 6,475,564 | B1 | 11/2002 | Carter et al. |
| 6,887,743 | B2 | 5/2005 | Bullock et al. |
| 6,888,160 | B1 | 5/2005 | Nakajima et al. |
| 6,936,537 | B2 | 8/2005 | Hogle et al. |
| 7,022,556 | B1 | 4/2006 | Adachi |
| 7,052,940 | B2 | 5/2006 | Lee |
| 7,211,524 | B2 | 5/2007 | Ryu et al. |
| 2001/0024844 | A1* | 9/2001 | Kobayashi et al. ............ 438/155 |
| 2002/0015130 | A1* | 2/2002 | Munakata et al. ............ 349/172 |
| 2002/0063677 | A1 | 5/2002 | Drzaic |
| 2003/0032305 | A1 | 2/2003 | Yau et al. |
| 2003/0186494 | A1* | 10/2003 | Rantala et al. ................ 438/200 |
| 2004/0166240 | A1* | 8/2004 | Rhee et al. ............... 427/255.28 |
| 2005/0042885 | A1* | 2/2005 | Li et al. .......................... 438/778 |
| 2006/0145141 | A1* | 7/2006 | Miura et al. .................... 257/40 |
| 2006/0148151 | A1 | 7/2006 | Murthy et al. |
| 2006/0160376 | A1 | 7/2006 | Padhi et al. |
| 2006/0170067 | A1* | 8/2006 | Maekawa et al. ............ 257/401 |
| 2006/0276054 | A1 | 12/2006 | Lakshmanan et al. |
| 2006/0292726 | A1* | 12/2006 | Akimoto et al. ................ 438/30 |
| 2007/0148990 | A1* | 6/2007 | DeBoer et al. ................ 438/778 |
| 2007/0166945 | A1* | 7/2007 | Tanabe et al. ................ 438/401 |
| 2007/0287237 | A1* | 12/2007 | Rockenberger et al. ...... 438/163 |
| 2008/0018850 | A1* | 1/2008 | Shih et al. ..................... 349/152 |
| 2008/0042105 | A1 | 2/2008 | Mayorga et al. |
| 2008/0102206 | A1 | 5/2008 | Wagner |
| 2008/0102223 | A1 | 5/2008 | Wagner |
| 2008/0202793 | A1* | 8/2008 | Kaltenegger et al. ..... 174/137 B |
| 2008/0233299 | A1* | 9/2008 | Kaltenegger et al. ...... 427/385.5 |
| 2008/0237181 | A1 | 10/2008 | Wagner |
| 2008/0275273 | A1* | 11/2008 | Effenberger et al. ........... 568/14 |
| 2009/0189149 | A1* | 7/2009 | Jeong et al. ..................... 257/40 |

FOREIGN PATENT DOCUMENTS

| | | |
|---|---|---|
| WO | 9413018 | 6/1994 |
| WO | 2005/071478 | 8/2005 |
| WO | 2008 066622 | 6/2008 |

OTHER PUBLICATIONS

Teresa et al., 2008, "Electric properties depending on temperature in SiOC dielectric layer", Nano/Micro Engineered and Molecular Systems, 3rd IEEE International Conf.

Hegemann et al., 1998, "Deposition of SiOx Films from O2/HMDSO Plasmas", Surface and Coatings Technology, Elsevier, Amsterdam, vol. 116-119, p. 1033-1036.

Han et al., 2009, "Amorphous silicon thin-film transistors with field-effect mobilities of 2a cm2/va s for electrons and 0.1acm2/va s for holes", Appl. Phys. Lett, 94(16): p. 162105.

Han et al., 2009, "A New Gate Dielectric for Highly Stable Amorphous-Silicon Thin-Film Transistors with Electron Field-Effect Mobility", IEEE Electron Device Letters 30(5):502-504.

Bhattacharya et al., 2006, "Plastic deformation of a continuous organic light emitting surface", Appl. Phys. Lett. 88:033507.

Cao et al., 2006, "Bilayer Organic-Inorganic Gate Dielectrics for High-Performance, Low-Voltage, Single-Walled Carbon Nanotube Thin-Film Transistors, Complementary Logic Gates, and p-n. Diodes on Plastic Substrates", Adv. Functional Mater. 16:2355-2362.

Chang et al., "Investigation of the low dielectric siloxane-based hydrogen silsequioxane (HSQ) as passivation layer on TFT-LCD" Thin Solid Films 516:374-377.

Cherenack et al. "Self-alignment techniques for fabricating a-Si: H TFTs at 300 C on clear plastic", Proc. of the 5th International TFT Conference.

Cho et al., 2008, "Highly flexible, transparent, and low resistance indium zinc—oxide—Ag—indium zinc oxide multilayer anode on polyethylene terephthalate substrate for flexible organic light-emitting diodes", Thin Solid Films 7881-7885.

Choi et al., 2000, "Hydrogenated Amorphous Siicon Thin-Film Transistor with a Thin Gate Insulator", IEEE Electron Device Letters 21:18-20.

Chou et al., 1996, "Application of Liquid Phase Deposited Silicon Dioxide to Metal-Oxide-Semiconductor Capacitor and Amorphous Silicon Thin-Film Transistor", IEEE Transactions on Electron Devices 45:599-604.

Fujimoto et al., 1992, "Study of the Vth shift of the thin-film transistor by the bias temperature stress test", IBM J. Res. Develop 36:76-82.

Fukuda et al., 1993, "a-SI TFTs with Stacked Gate Insulator of CVC-SiO2/PECVD-SiNx", Electronics and Communications in Japan, Part 2, vol. 76: 184-191.

Gleskova et al., 2001, "150C Amorphous Silicon Thin-Film Transistor Technology for Polyimide Substrates", J. of the Electrochem. Soc., 148(7):G370-G374.

Gleskova et al., 1999, "Failure resistance of amorphous silicon transistors under extreme in-plane strain", Appl. Phys. Lett 75(19):3011-3013.

Griep et al., 1987, "High Performanc TFT DF a-Si:h on a SiO2Dielectric", J. of Non-Crystalline Solids 97 & 98:313-316.

Gu et al., 1997, "Vacuum-deposited, nonpolymeric flexible organic light-emitting devices", Optics Lett, 22(3):172-174.

Guha et al., 1985, "Influence of stress on light induced effects in amorphous silicon alloys", Appl. Phys. Lett. 47 (9):947-949.

Han et al., 2009, "Properties of a Permeation Barrier Material Deposited from Hexamethyl Disiloxane and Oxygen", J. of the Electrochem. Soc. 156(2):H106-H114.

Han et al., 2009, "Amorphous silicon thin-film transistors with field effect mobilities of 2 cm2/V s for electrons and 0.1 cm2/V s for holes", Appl. Phys. Lett. 94:162105.

Hekmatshoar et al., 2009, "Tradeoff regimes of lifetime in amorphous silicon thin-film transistors and a universal lifetime comparison framework", Appl. Phys. Lett. 94:143504.

Ibaraki et al., 1991, "A New A-Si TFT With SiO2/SiN Gate Insulator for 10.4-inch LCDS", Toshiba Corporation Research and Development Center.

Jedaa et al., 2009, "Toward strain resistant flexible organic thin film transistors", Appl. Phys. Lett. 95:103309.

Kim et al., 1994, "Characteristics of hydrogenated morphous silicon thin-film transistor" , J. Appl. Phys. 76 (11):7601-7605.

Kim et al., 1994, "Performance improvement of amorphous silicon thin-film transistors with SiO2 gate Insulator by N2 plasma treatment", Appl. Phys. Lett. 64(6):775-776.

Lee et al., 2005, "Flexible all-polymer field effect transistors withoptical transparencey using electrically conducting polymers" Thin Solid Films 477:169-173.

Leterreir, 2003, "Durability of nonosized oxygen-barrier coatings on polymers", Progress in Materials Science 48:1-55.

Mandlik et al., 2008, "A single-layer permieatio barrier for organic light-emitting displays", Appl. Phys. Lett. 92:103309.

Paetzold et al., 2003, "Performance of flexible polymeric light-emitting diodes under bending conditions", Appl. Phys. Lett 82(19):3342-3344.

Powell et al., 1992, "Bias-stress-induced creation and removal of dangling-bond states in amorphous silicon thin-film transistors", Appl. Phys. Lett. 60(2):207-209.

Sekitani et al., "Ultrafeexilbe organic field-effect transistors embedded at a neutral strain position", Appl. Phys. Lett. 87:173502.

Sekitani et al., "Bending Effect of Organic Field-Effect Transistors with Polyimide Gate Dielectric Layers", Japanese J. of Appl. Phys. 44(4B):2841-2843.

Sony: Releases: May 26, 2010. "Sony develops a "Rollable" OTFT Driven OLED display that can wrap around a pencil".

Striakhilev et al., 2006, "Amorphous Silicon Display Backplanes on Plastic Substrates", J. of Display Tech. 2 (4):364-371.

Suo et al., 1999, "Mechanics of rollable and foldable film-on-foil electronics", Appl. Phys. Lett. 74(8):1177-1179.

Suo et al., 2005, "Micromechanics of Macoelectronics", China Particuology, 3(6):321-328.

Won et al., 2004, "Effect of Mechanical and Electrical Stresses on the Performance of a a-Si:H TFT on Plastic Substrate", J. of the Electrochemical Soc. 151(3):G167-G170.

Wu et al., 2003, "Plasma-Enhanced CVD of Organosilicate Glass (OSG) Films Deposited From Octamethyltrisiloxane, Bis

(56) References Cited

OTHER PUBLICATIONS (trimethylsiloxy)methylsilane, and 1,1,3,3,-Tetramethyldisiloxane", Plasmas and Polymers, 8(1):31-41.

Yang et al., 2002, "The structures and properties of hydrogen silsequioxane (HSQ) films produced by thermal curing"J. Mater. Chem, 12:1138-1141.

Yeh et al.,1999, "Amorphous-Silicon Thin-Film Transistor with Liquid Phase Deposition of Silicone Dioxide Gate Insulator", IEEE Electron Device Letters, 20(3):138-139.

International Preliminary Report on Patentability for PCT/US2009/052233 mailed on Feb. 17, 2011.

\* cited by examiner

HYBRID DIELECTRIC MATERIAL FOR THIN FILM TRANSISTORS

RELATED APPLICATION

This application is a U.S. national stage application under 35 U.S.C. 371 of PCT/US2009/052233, filed Jul. 30, 2009, which claims priority of U.S. Provisional Application No. 61/086,047, filed on Aug. 4, 2008, both of which are incorporated herein by reference in their entirety.

TECHNICAL FIELD

The present invention relates to thin film transistors.

BACKGROUND

A thin film transistor (TFT) is a particular type of field effect transistor, made by depositing thin films of a semiconductor active layer, a dielectric layer, and metallic contacts over a supporting substrate. The primary application of TFTs is in liquid crystal displays, and for this reason the most common substrate is glass. This differs from conventional transistors used in electronics, where the semiconductor material, typically a silicon wafer, is the substrate. Transparent TFTs (TTFTs) are particularly desirable for displays that rely on pixel-by-pixel modulation of light emitted by a backlight.

TFTs can be made using a wide variety of semiconductor materials. A common material is silicon. The characteristics of a silicon-based TFT depend on the silicon crystalline state. The semiconductor layer can be amorphous silicon or microcrystalline silicon, or it can be annealed into polysilicon. Other materials which have been used as semiconductors in TFTs include compound semiconductors such as cadmium selenium (CdSe) and metal oxides such as zinc oxide. TFTs have also been made using organic materials (Organic TFTs or OTFTs).

The glass substrates used in typical liquid crystal displays cannot withstand the high temperatures characteristic of polysilicon transistor fabrication. For this reason, amorphous silicon, because of its low dark conductivity and relatively easy fabrication on large area substrates at moderate temperatures, is a very effective active layer material for high resolution large area displays. The most common TFTs in use today are based on hydrogenated amorphous silicon ("a-Si:H") as the semiconductor active layer.

Chemical vapor deposition (CVD), plasma-enhanced chemical vapor deposition (PE-CVD), and physical vapor deposition methods such as sputtering are most commonly employed for the deposition of the silicon, insulating, and conducting layers that constitute a TFT. Solution-processed transparent TFTs based on chemical precipitation of zinc oxide and silicon dioxide have also been reported.

In a transistor, there are typically three electrodes, serving as gate, source, and drain. The gate electrode supplies the controlling voltage to the transistor, and the semiconductor channel of the transistor conducts current from the source to the drain in response to the gate voltage. The gate insulator, or gate dielectric, of a TFT electrically insulates the gate from the semiconductor channel. Superior performance in a TFT requires a high channel conductance, fast "on" and "off" responses to the applied gate voltage, a very rapid increase and decrease in the source-to-drain current as the gate voltage rises and falls past a threshold switching value, minimal current leakage from the source to the drain in the absence of an applied gate voltage and negligible current leakage from the channel to the gate. These operating characteristics should be stable, and should not change or drift after a long period of applied gate voltage.

The gate dielectric material plays a critical role in determining the performance of a TFT. In general, a thinner gate dielectric layer leads to a greater voltage gradient across the gate dielectric layer, and this in turn leads to the more rapid generation of more charge carriers in the semiconductor, and permits a reduction in driving voltage. The properties of the gate dielectric material set a limit on how thin this layer can be. The material must not break down and conduct current under the influence of the voltage gradient, it must bind to the semiconductor channel material without leaving too many dangling bonds ("interface states"), it must be tough enough to withstand thermal cycling without fracturing or separating from the various materials it is bonded to (typically, the substrate, gate, and dielectric layers), and it must exhibit stable properties under extended application of a gating voltage. Furthermore, in order to be commercially feasible, the material should be easily laid down and patterned using existing microfabrication technology. It should be capable of producing extremely thin layers with extraordinary uniformity, because large displays can contain millions of pixels, and the acceptable defect rate among the millions of TFTs in each such display is generally zero. Among the most suitable materials for TFTs are silicon oxide ($SiO_x$) and silicon nitride ($SiN_x$). Although silicon nitride is generally considered to be the superior gate dielectric for a-Si:H TFTs, there are disadvantages to $SiN_x$ as an gate dielectric: it is brittle, subject to thermal stress upon cooling, and has relatively low transparency. Prolonged application of a gating bias can cause charge trapping at the interface with the a-Si:H, which leads to a shift in the threshold voltage of the TFT. There remains a need for more stable, flexible and transparent gate dielectric materials, especially for use on flexible substrates.

In addition to the interface with the gate dielectric, the interface on the other side of the a-Si:H channel, the so-called "back-channel", also influences the performance of the transistor. In particular, the etching and subsequent application of a dielectric "passivation layer" to the a-Si:H back channel can lower the density of surface states, and control surface leakage and photoleakage currents. In a back channel etched (BCE) a-Si:H TFT, a passivation layer is necessary to protect the back channel from damage and contamination during subsequent processing. For conventional BCE TFT devices, PECVD-deposited silicon nitride ($SiN_x$) is commonly used as a passivation layer. However, $SiN_x$, due to its relatively high dielectric constant, high stress and low transmittance, constrains the size and performance of the device. There remains a need for lower-dielectric, lower-stress, and higher-transmittance dielectric materials for back-channel passivation in TFTs.

Liquid crystal display panels are increasingly popular for computer display screens and flat-panel television sets. The market for these commercial products continuously demands larger-sized displays, higher resolutions, and higher color image rendering capabilities. There is a need for thin film transistors, suitable for use as switching devices in active-matrix displays, that are economical to manufacture, with low defect rates and improved electrical characteristics, such as high field effect mobility, reliability against high frequency, and low leakage current.

Organic high-emitting displays are a new technology for flat-panel displays. Commercial production of OLED displays is accelerating rapidly, because of their several advantages over liquid-crystal displays. Organic light-emitting displays rely on thin-film transistors that continuously provide direct current, and as a result there is a need for transistors that are particularly stable in long-term use.

Volatile silanes and silicones are commonly used as silicon source gases for plasma enhanced chemical vapor deposition (PE-CVD) growth of carbon-containing silicon oxide films, sometimes referred to as organosilicate glass (OSG). OSG is commonly used for insulating layers (low-k dielectrics) between passive conductive elements, and as the underlying insulator in damascene processes. At high oxygen/silicone ratios, the resulting films are harder and more silica-like than at low oxygen/silicone ratios, and such films have been used as hard protective coatings on polymers and metals.

SUMMARY

The present invention provides transistors having one or more insulating layers made from a hybrid silica-silicone material, also known in the art as an organosilicate glass (OSG). The OSG layers of the invention have physical and electrical properties that make them particularly suited for use in thin-film field-effect transistors. In certain embodiments, the invention provides gate dielectric layers, back channel passivation layers, and/or substrate passivation layers, which consist essentially of the hybrid silica-silicone material. The hybrid material is preferably formed by plasma-enhanced chemical vapor deposition from a gas mixture comprising a volatile silicone precursor and an oxidant. The oxidant may be any oxidant gas known in the art, including but not limited to oxygen gas, hydrogen peroxide, ozone, and nitrous oxide. Oxygen gas is preferred.

The gas mixture may optionally include inert gases such as argon, and reactive gases that contribute atoms to the gate insulator layer. Examples include, but are not limited to, reactive gases that contribute nitrogen atoms to the organosilicate glass. Suitable nitrogen donors include, but are not limited to, organic silazanes and silylated nitrogen compounds, ammonia, and nitrogen gas.

In one aspect, the invention provides a process for depositing a layer of organosilicate glass, and for the use of this process in depositing gate dielectric, back channel passivation, and substrate passivation layers in the manufacture of TFTs, other insulated gate field effect transistors, and related devices.

In certain embodiments, the present invention provides an electronic device comprising a field-effect transistor, the field-effect transistor comprising: a semiconductor active layer comprising a semiconductor material; a source electrode and a drain electrode; a gate electrode; and an insulating material disposed between the gate electrode and the semiconductor active layer, the insulating material consisting essentially of an organosilicate glass.

In certain embodiments, the present invention provides a method of making a field-effect transistor, comprising the steps of: providing a substrate; forming a gate insulator layer over the substrate by steps comprising: (a) placing the substrate in a deposition chamber; (b) introducing into the chamber a source gas comprising a volatile silicone precursor and at least one oxidant gas selected from the group consisting of oxygen, ozone, hydrogen peroxide, and nitrous oxide; and (c) applying radio frequency, microwave frequency, or DC power to the chamber.

The electronic device may be the field-effect transistor itself (e.g., mounted on a substrate) or any device that uses a field-effect transistor, including organic light emitting devices and display screens (such as liquid crystal displays used in flat panel televisions and computer monitors). Where one component is in "electrical connection" or "electrically connected" with another component, it means that the components are arranged such that electrical current may flow from one component to the other. There may or may not be other components (e.g., conducting or semiconducting materials) physically between the two components.

Where a first component is described as being "over" a second component, at least a portion of the first component is disposed further away from substrate. This includes the possibility that the first and second components are in physical contact with each other (e.g., the first component is disposed on the second component) or there may be other components between the first and second components. For example, in a top-gate architecture for a TFT, the gate electrode may be described as being disposed "over" a substrate, even though there are various components in between.

DETAILED DESCRIPTION OF THE INVENTION

Figure 1:
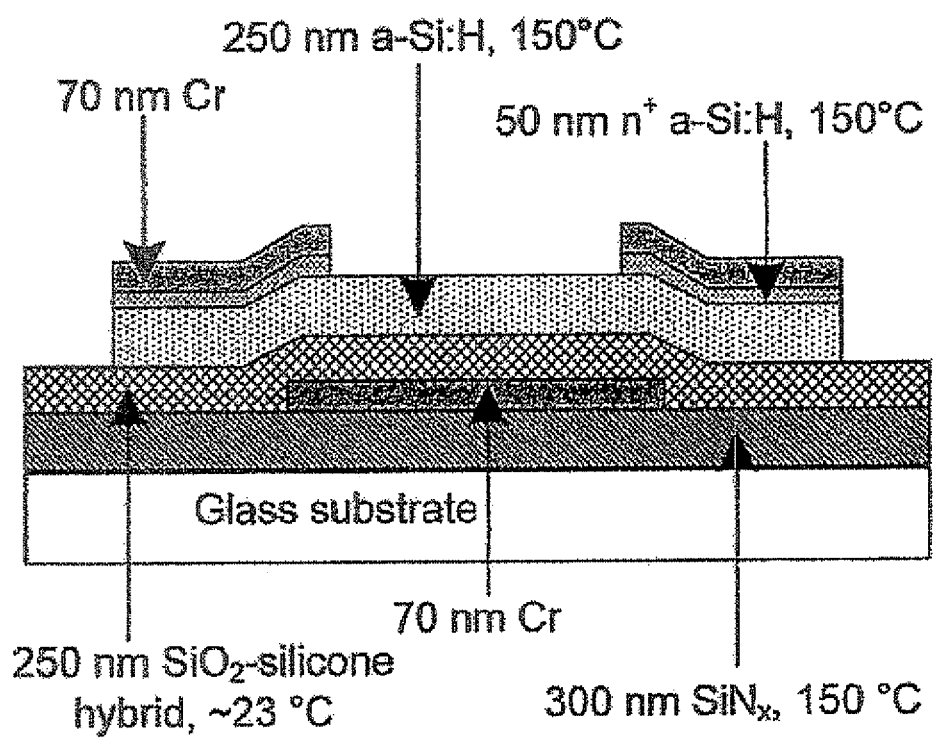
FIG. 1 is a schematic cross-sectional view of an a-Si:H TFT according to an embodiment of the invention, with a 250 nm hybrid dielectric gate insulating layer deposited at nominal room temperature.

The invention provides a field-effect transistor comprising one or more insulating layers, which consist essentially of an organosilicate glass. In some embodiments, one or more of the insulating layers consist entirely of the organosilicate glass. Preferably, the transistor comprises a gate insulator material disposed between a gate electrode and a semiconductor active layer, wherein the gate insulator material consists essentially (or entirely) of an organosilicate glass. The transistors of the invention may optionally comprise a back channel passivation layer, and/or a subbing layer, consisting essentially (or entirely) of an organosilicate glass.

The organosilicate glass preferably comprises from about 70% to about 95% silicon dioxide and about 30% to about 5% siloxane polymer. The organosilicate glass is most conveniently deposited by plasma-enhanced chemical vapor deposition from a gas mixture comprising one or more volatile silicone precursors and an oxidant gas such as oxygen, in which the volume flow ratio of oxidant gas to volatile silicone precursor is at least 25:1. The volume flow percentage, measured in standard cubic centimeters per minute, of volatile silicone precursor in oxygen is preferably between 0.1% and 10%, more preferably between 0.5% and 8%, still more preferably between 1% and 6%, and is most preferably between 2% and 5%.

The transistors of the invention may be fabricated upon a rigid or a flexible substrate, which may optionally include one or more subbing layers (to improve adhesion) or passivation layers disposed between the substrate and the transistor. The passivation layer preferably consists essentially (or entirely) of an organosilicate glass, and may optionally be laid down over an adhesion-improving (subbing) layer of SiNx.

The invention also provides a method of forming an "inverted staggered" field-effect transistor having an organosilicate glass gate insulator layer, comprising the steps of: (a) depositing a gate electrode on a substrate; (b) placing the substrate and gate electrode in a PE-CVD chamber; (c) introducing into the chamber a source gas comprising a volatile silicone precursor and at least one oxidant gas selected from the group consisting of oxygen, ozone, hydrogen peroxide, and nitrous oxide; and (d) applying radio frequency, microwave frequency, or DC power to the chamber; so that a layer of organosilicate glass is deposited on the gate electrode and substrate.

The method further comprises the step of depositing source and drain layers, preferably accomplished by depositing a layer of amorphous hydrogenated silicon, a layer of doped (donor or acceptor) amorphous hydrogenated silicon, and a layer of nanocrystalline, microcrystalline, or polycrystalline silicon. The method further comprises depositing a conductive layer to serve as source and drain electrodes.

The substrate may be any substrate known in the art upon which field effect transistors can be made, for example, a glass, a polymer foil or a metal foil. Lithography, patterning and etching of the various layers, so as to arrive at a functional transistor, are carried out as is well-known in the art.

In an alternative embodiment, the invention also provides a method of forming a "top gate" field-effect transistor having an organosilicate glass gate insulator layer, comprising the steps of: (a): depositing a source/drain conductor layer on a substrate; (b) depositing a layer of doped amorphous hydrogenated silicon on the source/drain conductor layer; (c) patterning the doped amorphous hydrogenated silicon layer and source/drain conductor layer, so as to form separate source and drain electrodes; (d) depositing a layer of amorphous hydrogenated silicon; (e) mounting the substrate with electrodes and silicon layer in a PE-CVD chamber; (f) introducing into the chamber a source gas comprising a volatile silicone precursor and at least one oxidant gas selected from the group consisting of oxygen, ozone, hydrogen peroxide, and nitrous oxide; and (g) applying radio frequency, microwave frequency, or DC power to the chamber; so that a layer of organosilicate glass is deposited on the amorphous hydrogenated silicon layer.

Typically, the above method will further comprise the steps of depositing a gate conductor layer on the amorphous hydrogenated silicon, and patterning the gate conductor so as to form a gate electrode, and the step of patterning the organosilicate glass, amorphous hydrogenated silicon, and doped amorphous hydrogenated silicon layers, so as to expose the source and drain electrodes.

In yet another embodiment, the invention provides a method of forming a transistor having an organosilicate glass gate insulator, comprising the steps of (a) preparing on a substrate a film of silicon, wherein the silicon is selected from the group consisting of amorphous silicon, nanocrystalline silicon, microcrystalline silicon, or polycrystalline silicon; (b) placing the substrate in a PE-CVD chamber; (c) introducing into the chamber a source gas comprising a volatile silicone precursor and at least one oxidant gas selected from the group consisting of oxygen, ozone, hydrogen peroxide, and nitrous oxide; and (d) applying radio frequency power to the chamber; so that a layer of organosilicate glass is deposited on the silicon film and substrate.

The above-described method may further comprise the steps of: (a) patterning the organosilicate glass layer to expose the silicon layer; (b) providing a layer of doped silicon on the exposed silicon, by doping the exposed silicon by ion implantation or by depositing a layer of doped silicon; (c) depositing a layer of an electrode material; and (d) patterning the electrode material so as to form gate, source, and drain electrodes.

All of the above methods may further comprise the step of depositing a passivating layer of organosilicate glass on any exposed amorphous hydrogenated silicon.

In certain embodiments, a gate insulator layer of the present invention comprises a hybrid silica-silicone material, also known in the art as an organosilicate glass. Plasma-enhanced CVD (PE-CVD) is preferably used for deposition of the layer of hybrid silica-silicone material. PE-CVD may be desirable for various reasons, including low temperature deposition (e.g., less than 150° C.), uniform coating formation, and controllable process parameters. Various PE-CVD processes which are suitable for use in the present invention are known in the art, including those that use radio frequency (RF), microwave, or direct current (DC) energy to generate the plasma.

The volatile silicone precursor may be any material that is capable of forming a layer of organosilicate glass when deposited by chemical vapor deposition. Various such precursor materials are suitable for use in the present invention, and are chosen for their various characteristics. For example, a precursor material may be chosen for its content of chemical elements, the stoichiometric ratios of the chemical elements present, and/or the polymeric and non-polymeric materials that are formed under PECVD. The siloxanes are a class of compounds particularly suitable for use as the precursor material. Representative examples of siloxane compounds include hexamethyldisiloxane (HMDSO) and dimethyldimethoxysilane. When deposited by PECVD in the presence of an oxidant, these siloxane compounds are able to form both silicone polymers and silicon dioxide, and under appropriate conditions a hybrid of the two, an organosilicate glass, is deposited. The precursor material may also be chosen on the basis of other characteristics such as cost, non-toxicity, viscosity, freezing point, volatility, and the available levels of purity.

Other organosilicon compounds suitable for use as a precursor material include, but are not limited to, methylsilane; dimethylsilane; vinyl trimethylsilane; trimethylsilane; tetramethylsilane; ethylsilane; disilanomethane; bis(methylsilano)methane; 1,2-disilanoethane; 1,2-bis(methylsilano)ethane; 2,2-disilanopropane; 1,3,5-trisilano-2,4,6-trimethylene, and fluorinated derivatives of these compounds. Phenyl-containing organosilicon compounds suitable for use as a precursor material include: dimethylphenylsilane and diphenylmethylsilane. Oxygen-containing organosilicon compounds suitable for use as a precursor material include: dimethyldimethoxysilane; tetramethydisiloxane, 1,3,5,7-tetramethylcyclotetrasiloxane; 1,3-dimethyldisiloxane; 1,1,3,3-tetramethyldisiloxane; 1,3-bis(silanomethylene)disiloxane; bis(1-methyldisiloxanyl)methane; 2,2-bis(1-methyldisiloxanyl)propane; 2,4,6,8-tetramethylcyclotetrasiloxane; octamethyltrisiloxane, octamethylcyclotetrasiloxane; 2,4,6,8,10-pentamethylcyclopentasiloxane; 1,3,5,7-tetrasilano-2,6-dioxy-4,8-dimethylene; hexamethylcyclotrisiloxane; 1,3,5,7,9-pentamethylcyclopentasiloxane; hexamethoxydisiloxane, decamethylcyclopentasiloxane, 2,2-dialkyl-1,3-dioxa-2-silacyclopentanes (where alkyl is methyl, ethyl, propyl, or isopropyl), and fluorinated derivatives of these compounds.

Preferably, the volatile silicone precursor is tetramethydisiloxane, hexamethyldisiloxane, octamethyltrisiloxane, hexamethylcyclotrisiloxane, octamethylcyclotetrasiloxane, decamethylcyclopentasiloxane, or a 2,2-dialkyl-1,3-dioxa-2-silacyclopentanes. Most preferred is hexamethyldisiloxane.

The organosilicate glass is preferably deposited by plasma-enhanced chemical vapor deposition (PE-CVD) from a gas mixture comprising a volatile silicone precursor, as described above, and an oxidant gas which is preferably oxygen. Optionally, the precursor gas mixture may include one or more volatile sources of nitrogen, such as for example nitrogen gas, ammonia, organosilazanes, and silylated amine compounds.

Nitrogen-containing organosilicon compounds suitable for use as a nitrogen source material include, but are not limited to, hexamethyldisilazane; divinyltetramethyldisilazane; hexamethylcyclotrisilazane; dimethylbis(N-methylacetamido)silane; dimethylbis-(N-ethylacetamido)silane; methylvinylbis(N-methylacetamido)silane; methylvinylbis(N-butylacetamido)silane; methyltris(N-phenylacetamido)silane; vinyltris(N-ethylacetamido)silane; tetrakis(N-methylacetamido)silane; diphenylbis(diethylaminoxy)silane; methyltris(diethylaminoxy)silane; and bis(trimethylsilyl)carbodiimide.

When deposited by PECVD, the precursor material may form various types of polymeric materials in various amounts, depending upon the type of precursor material, the quantity and nature of the oxidant and other reactive gases, such as nitrogen donors, and the physical reaction conditions. Where organosilicon compounds are used as the precursor material, the deposited hybrid layer may include, for example, polymer chains incorporating Si—O bonds, Si—C bonds, and/or Si—O—C bonds to form polysiloxanes, polycarbosilanes, and polysilanes, and varying proportions of a predominantly inorganic silica-like phase. For example, where organosilicon compounds are used as the precursor material in combination with an oxygen-containing oxidant gas, the non-polymeric material may include silicon oxides, such as SiO, $SiO_2$, and mixed-valence oxides $SiO_x$. When deposited with a nitrogen-containing reactant gas, the non-polymeric material may also include silicon nitrides ($SiN_x$), silicon oxycarbide, and silicon oxynitrides.

When using PE-CVD, one or more precursor materials may be used in conjunction with one or more reactant gases that react with the precursor material in the PE-CVD process. The use of reactant gases in PE-CVD is known in the art, and various reactant gases are suitable for use in the present invention, including oxygen-containing gases (e.g., $O_2$, ozone, hydrogen peroxide, nitrous oxide, organic peroxides and hydroperoxides, and water) and nitrogen-containing gases (e.g., ammonia and hexamethyldisilazane). The reactant gas may be used to vary the stoichiometric ratios of the chemical elements present in the reaction mixture. For example, when a siloxane precursor material is used with an oxygen or nitrogen-containing reactant gas, the reactant gas will change the stoichiometric ratios of oxygen or nitrogen in relation to silicon and carbon in the reaction mixture. This stoichiometric relation between the various chemical elements (e.g., silicon, carbon, oxygen, nitrogen) in the reaction mixture may be varied in several ways. The concentrations of the precursor materials and reactant gases in the reaction may be controlled by varying the flow rates of the precursor material and reactant gases into the reaction. Another way is to vary the type of precursor materials or reactant gases used in the reaction. The use of a cyclic siloxane, for example, in place of the analogous linear siloxane, will result in a lower ratio of carbon to silicon in the organosilicate glass.

Changing the stoichiometric ratios of the elements in the reaction mixture can affect the properties and relative amounts of the polymeric and non-polymeric materials in the deposited hybrid layer. For example, a siloxane gas may be combined with varying amounts of oxygen to adjust the relative amounts of silica-like and silicone-like material in the hybrid layer. By increasing the stoichiometric ratio of oxygen in relation to silicon or carbon, the amount of silica-like material may be increased. Similarly, by reducing the stoichiometric ratio of oxygen, the relative amount of carbon-containing silicone-like material may be increased. The composition of the hybrid layer may also be varied by adjusting other reaction conditions. For example, in the case of PE-CVD, process parameters such as RF power and frequency, deposition pressure, deposition time, and gas flow rates can be varied.

Figure 13:
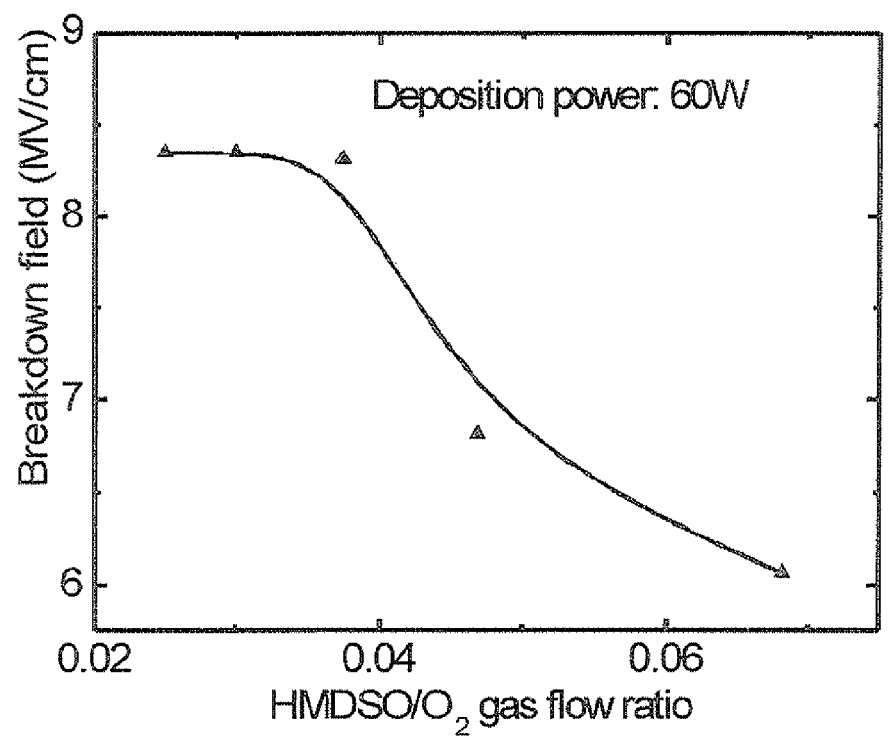
FIG. 13 shows the breakdown field of a hybrid dielectric layer as a function of the molar ratio of hexamethydisiloxane to oxygen used to deposit the layer.
Figure 14:
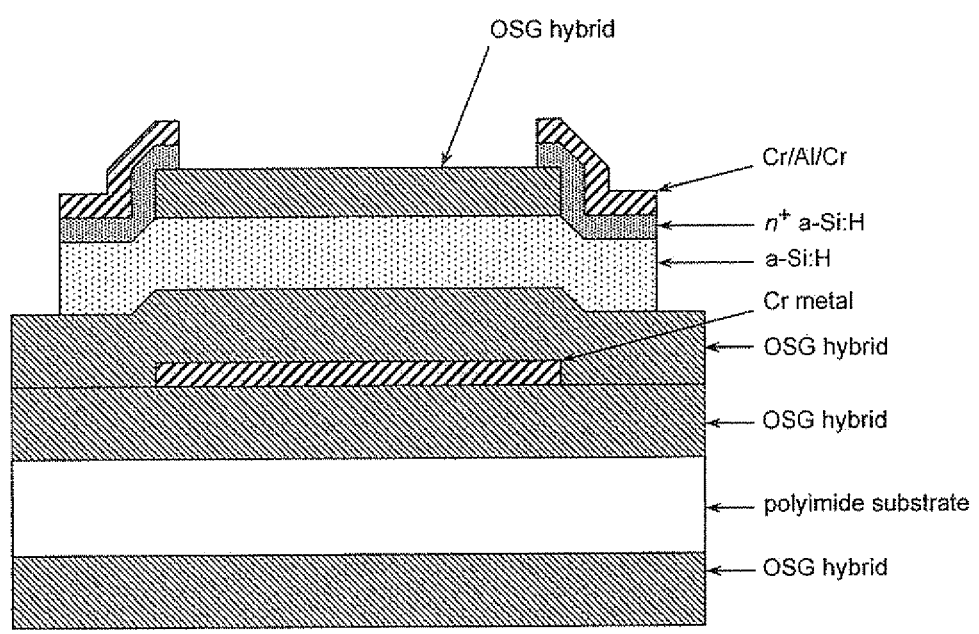
FIG. 14 shows a flexible TFT having a hybrid OSG back channel passivation layer.

In the present invention, the organosilicate glasses employed as gate insulator layers are rich in the silica-like phase. This is most conveniently achieved by depositing the layer from an oxygen-rich precursor gas mixture. For example, when using oxygen as the oxidant gas and hexamethyldisiloxane as the volatile silicone precursor in the present invention, the volume flow percentage of silicone precursor in oxygen, as measured in standard cubic centimeters per minute, is between 0.1% and 10%. The volume flow ratio corresponds approximately to the mole ratio of the two molecular species in the CVD chamber during the deposition process. Preferably, the volume flow percentage of silicone precursor in oxygen is between 0.5% and 8%, more preferably it is between 1% and 6%, and still more preferably it is between 2% and 5%. These figures may be adjusted, as necessary, to account for silicone precursors having different molecular weights, different chemical compositions, and correspondingly different silicon and carbon contents per standard cubic centimeter. In the case of hexamethyldisiloxane, "oxygen-rich" conditions refer to relative oxygen flow rates greater than about 25:1 relative to the flow of hexamethydisiloxane. The percentage of HMDSO is most preferably between 2% and 4%. FIG. 13 shows how the molar ratio of oxygen to hexamethyldisiloxane affects the breakdown voltage of the resulting hybrid dielectric.

Thus, by using the methods of the present invention, it is possible to form a layer of hybrid organosilicate glass having both polymeric (silicone-like) and non-polymeric (silica-like) components, and having bulk characteristics suitable for use as a gate insulator.

The organosilicate glass gate insulator material of the invention comprises from about 70% to about 95% silicon dioxide (silica-like material) and from about 30% to about 5% siloxane polymers (silicone-like material). As used herein, percentages of silicon dioxide and siloxane polymers refer to the molar ratio of silicon atoms bonded only to oxygen and silicon atoms bonded to at least one carbon. This ratio may be determined by means of various techniques appropriate to surface and thin-film chemical and elemental analysis, such as infrared absorption spectroscopy, Raman scattering spectroscopy, electron spectroscopy for chemical analysis (ESCA), Rutherford backscattering, and the like.

The methods of the invention provide a gate insulator layer that is particularly suitable for use in thin-film transistors (TFTs). The gate insulator layer can be made extremely thin, with excellent uniformity and a very low level of defects, which are desirable properties in the manufacture of display devices based on very large arrays of TFTs. The gate insulator layer may have a thickness of less than 300 nm, and in some cases, less than 250 nm, and in some cases, less than 150 nm. This is a considerable improvement over silicon nitride gate dielectrics, which typically require at least a 300 nm thickness to perform effectively. (See, for example, Lin et al., "Amorphous silicon thin-film transistors with field-effect mobilities of 2 $cm^2/V \cdot s$ for electrons and 0.1 $cm^2/V \cdot s$ for holes," Appl. Phys. Lett. 94:162105 (April 2009)). TFT's of the present invention may be able to perform so effectively with very thin gate insulator thicknesses because the organosilicate glass hybrid material has fewer microcracks that permit current leakage. In contrast, brittle materials such as $SiN_x$ and $SiO_2$ are known to suffer from such microcracks, resulting in current leakage. (See, for example, Lin Han et al., "A New Gate Dielectric for Highly Stable Amorphous-Silicon Thin-Film Transistors With ~1.5-$cm^2/V \cdot s$ Electron Field-Effect Mobility," IEEE Electron Device Lett. 30:5, pp. 502-504 (May 2009)). The gate insulators of the invention may form strong bonds to other materials used in the making of TFTs, and give rise to low numbers of interface states.

Because of the low temperatures involved in PE-CVD, the methods of the invention are particularly suitable for the manufacture of organic TFTs, which employ relatively heat-sensitive organic semiconductor materials as the active layer. The hybrid dielectric of the present invention has excellent properties when deposited by PE-CVD on substrates that are held at room temperature. This material is of particular advantage for thin film transistors used in flexible electronics, because it does not crack easily, unlike the conventional gate insulators, silicon nitride and silicon dioxide, which are brittle materials. Because the hybrid dielectric can be deposited at lower temperatures (e.g., about room temperature), there may be no contraction upon cooling, and a bonded layer does not generate stress through differential contraction at the interface with other layers. Since the coefficient of thermal expansion of the substrate need not be closely matched, the hybrid dielectrics of the invention make it feasible to build TFTs on a wider variety of substrate materials, in particular transparent, flexible plastic substrates that are desirable for use in lightweight, flexible LCD and OLED displays.

The invention also provides a field-effect transistor comprising a gate insulator material disposed between a gate electrode and a semiconductor active layer, wherein the gate insulator material comprises, or preferably consists essentially of, an organosilicate glass as described above. In this context, "consisting essentially of" means that there are no materials present, other than the silicon, carbon, hydrogen, oxygen, and optionally nitrogen provided by the volatile precursor gases describe herein, that have a functionally relevant effect on the insulating, dielectric, and barrier state properties of the organosilicate glass insulator layers of the invention. In preferred embodiments, the gate insulator material consists of an organosilicate glass as describe above, which may optionally have a nitrogen component.

Semiconductors suitable for the TFTs of the invention are all semiconductors known in the art, including but not limited to amorphous silicon, nanocrystalline silicon, microcrystalline silicon, polycrystalline silicon, zinc oxide, zinc tin oxide, and zinc gallium oxide. In view if the present state of the art, amorphous silicon is preferred, and hydrogenated amorphous silicon is more preferred.

Organic semiconductor materials for the organic semiconductor layer of the organic thin-film transistor of the invention may be any such materials as are known in the art. Most commonly, π-conjugated materials are used. Examples of the π-conjugated materials include but are not limited to polypyrroles such as polypyrrole, poly(N-substituted pyrrole), poly(3-substituted pyrrole), and poly(3,4-disubstituted pyrrole); polythiophenes such as polythiophene, poly(3-substituted thiophene), poly(3,4-disubstituted thiophene), and polybenzothiophene; polyisothianaphthenes such as polyisothianaphthene; polythienylenevinylenes such as polythienylenevinylene; poly(p-phenylenevinylenes) such as poly(p-phenylenevinylene); polyanilines such as polyaniline, poly(N-substituted aniline), poly(3-substituted aniline), and poly(2,3-substituted aniline); polyacetylenes such as polyacetylene; polydiacetylenes such as polydiacetylene; polyazulenes such as polyazulene; polypyrenes such as polypyrene; polycarbazoles such as polycarbazole and poly(N-substituted carbazole), polyselenophenes such as polyselenophene; polyfurans such as polyfuran and polybenzofuran; poly(p-phenylenes) such as poly(p-phenylene); polyindoles such as polyindole; polypyridazines such as polypyridazine; polyacenes such as naphthacene, pentacene, hexacene, heptacene, dibenzopentacene, tertabenzopentacene, pyrene, dibenzopyrene, chrysene, perylene, coronene, terylene, ovalene, quoterylene, and circumanthracene; derivatives (such as triphenodioxazine, triphenodithiazine, hexacene-6, 15-quinone) in which some of carbon atoms of polyacenes are substituted with atoms such as N, S, and O or with a functional group such as a carbonyl group; polymers such as polyvinyl carbazoles, polyphenylene sulfide, and polyvinylene sulfide.

Further, oligomers having repeating units in the same manner as in the above polymers, for example, thiophene hexamers including α-sexithiophene, α,ω-dihexyl-α-sexithiophene, α,ω-dihexyl-α-quinquethiophene, and α,ω-bis(3-butoxypropyl)-α-sexithiophene, or styrylbenzene derivatives, can be suitably employed.

Further, listed are metallophthalocyanines such as copper phthalocyanine and fluorine-substituted copper phthalocyanines; tetracarboxylic acid diimides of condensed ring compounds including naphthalene tetracarboxylic acid imides such as naphthalene 1,4,5,8-teracarboxylic acid diimide, N,N'-bis(4-trifluoromethylbenzyl)naphthalene 1,4,5,8-tetracarboxylic acid diimide, N,N'-bis(1H,1H-perfluoroctyl) naphthalene 1,4,5,8-tetracarboxylic acid diimide derivatives, N,N'-bis(1H,1H-perfluorobutyl)naphthalene 1,4,5,8-tetracarboxylic acid diimide derivatives, N,N'-dioctylnaphthalene 1,4,5,8-tetracarboxylic acid diimide derivatives, and naphthalene 2,3,6,7-tetracarboxylic acid diimides, and anthracene tetracarbocylic acid diimides such as anthracene 2,3,6,7-tetracarboxylic acid diimides; fullerenes such as $C_{60}$, $C_{70}$, $C_{76}$, $C_{78}$, and $C_{84}$; carbon nanotubes such as SWNT; and dyes such as merocyanines and hemicyanines.

Of these π conjugated compounds, preferably employed is at least one selected from the group consisting of oligomers which have thiophene, vinylene, thienylenevinylene, phenylenevinylene, p-phenylene, their substitution product or at least two kinds thereof as a repeating unit and have a repeating unit number n of from 4 to 10, polymers which have the same unit as above and a repeating unit number n of at least 20, condensed polycyclic aromatic compounds such as pentacene, fullerenes, condensed cyclic tetracarboxylic acid diimides of condensed ring compounds, and metallo-phthalocyanines.

Further employed as other materials for organic semiconductors may be organic molecular complexes such as a tetrathiafulvalene (TTF)-tetracyanoquinodimethane (TCNQ) complex, a bisethylenetetrathiafulvalene (BEDTTTF)-perchloric acid complex, a BEDTTTF-iodine complex, and a TCNQ-iodine complex.

The organic semiconductor layer may be subjected to a doping treatment by incorporating in the layer materials an electron accepting molecule (acceptor) or an electron donating molecule (donor), including but not limited to benzoquinone derivatives, tetracyanoethylene, tetracyanoquinodimethane; substituted amines such as phenylenediamine; anthracene, benzoanthracene and substituted benzoanthracenes, pyrene and substituted pyrenes; carbazole and its derivatives; and tetrathiafulvalene and its derivatives.

The invention also provides a method of forming a transistor having an organosilicate glass gate insulator layer by plasma-enhanced chemical vapor deposition, comprising the steps of: (a) depositing a gate electrode on a substrate; (b) mounting the substrate and gate electrode in a CVD chamber; (c) introducing into the chamber a source gas comprising a volatile silicone precursor and at least one oxidant gas selected from the group consisting of oxygen, ozone, hydrogen peroxide, and nitrous oxide; and (d) applying radio frequency, microwave frequency, or DC power to the chamber. A layer of organosilicate glass is thereby deposited on the gate electrode and substrate, which serves as the gate insulator.

Suitable substrates include glass, metal, and high-strength polymer film and foil substrates known in the art. High-strength polymer film substrates are desirable for making flexible displays, and include for example polyethylene terephthalate (PET) and polyimide foils and films. The substrate is preferably coated with a suitable subbing layer, as is known in the art. For example, with a glass substrate, silicon nitride or an organosilicate glass (which may be an organosilicate glass as described herein), may be employed. Polymer subbing layers have been developed for various other substrates such as metal and polymer substrates.

The method further comprises the step of depositing a layer of the active semiconductor material, preferably silicon, and more preferably amorphous hydrogenated silicon. A layer of doped amorphous hydrogenated silicon is deposited onto the amorphous hydrogenated silicon. Finally, a source/drain conductor layer is deposited, and this layer is patterned so as to produce source and drain electrodes. Suitable conductors are any of those known in the art, including but not limited to indium-tin oxide, chromium, aluminum, copper, and the like.

The patterning of the various layers, as carried out in practicing the present invention, may be accomplished by any of the various means known in the art. Methods based on photolithography may be employed, and those skilled in the art will be familiar with the use of appropriate resists and etching methods. The patterning methods may include the self-alignment of layers to previously patterned layers. Etching methods include, but are not limited to, various wet chemical and plasma methods. Suitable non-limiting methods are indicated in the examples below. Damascene methods may be employed where appropriate, for example, in laying down fine copper conductors.

An alternative method of forming a transistor having an organosilicate glass gate insulator layer by plasma-enhanced chemical vapor deposition, is also provided, which comprises the steps of: (a) depositing a semiconducting channel layer on a substrate; (b) depositing a layer of doped amorphous hydrogenated silicon on the source/drain conductor layer; (c) patterning the doped amorphous hydrogenated silicon layer and source/drain conductor layer, so as to form separate source and drain electrodes; (d) depositing a layer of amorphous hydrogenated silicon; (e) mounting the substrate and gate electrode in a CVD chamber; (f) introducing into the chamber a source gas comprising a volatile silicone precursor and at least one oxidant gas selected from the groups consisting of oxygen, ozone, hydrogen peroxide, and nitrous oxide; and (g) applying radio frequency, microwave frequency, or DC power to the chamber. In this way, a layer of organosilicate glass is deposited on the amorphous hydrogenated silicon layer. The transistor is completed by depositing a gate conductor layer; and patterning the gate conductor layer so as to form a gate electrode. The substrate is preferably coated with a suitable subbing or passivation layer, as is known in the art. For example with a glass substrate, silicon nitride, or an organosilicate glass which may be an organosilicate glass as described herein, may be employed. Polymer subbing or passivation layers have been developed for various other substrates such as metal and polymer substrates.

The organosilicate glass, amorphous hydrogenated silicon, and doped amorphous hydrogenated silicon layers are then patterned so as to expose the source and drain electrodes. Industry-standard methods for patterning and etching, such as reactive ion etching, that are suitable for silica are generally suitable for the hybrid OSG dielectric material of the present invention.

Yet another method of forming a transistor having an organosilicate glass gate insulator is provided, which comprises the steps of: (a) preparing, on a substrate, a film of amorphous silicon, nanocrystalline silicon, microcrystalline silicon, or polycrystalline silicon; (b) mounting the substrate in a CVD chamber; (c) introducing into the chamber a source gas comprising a volatile silicone precursor and an oxidant gas as describe above; and (d) applying radio frequency power to the chamber; whereby a layer of organosilicate glass is deposited on the silicon film and substrate. The substrate is preferably coated with a suitable subbing or passivating layer, as is known in the art. For example with a glass substrate, silicon nitride, or an organosilicate glass which may be an organosilicate glass as described herein, may be employed. Polymer subbing layers have been developed for various other substrates such as metal and resin substrates.

The method further comprises the steps of: (a) patterning the organosilicate glass layer to expose the silicon layer; (b) providing a layer of doped silicon on the exposed silicon, by doping the exposed silicon by ion implantation or by depositing a layer of doped silicon; (c) depositing a layer of an electrode material; and (d) patterning the electrode material so as to form gate, source, and drain electrodes.

The invention may also provide transistors made by any of the above-described methods. The following descriptions are intended to be exemplary of the invention, and do not represent the limits of the invention or limitations to the scope of the appended claims.

EXAMPLES

1.0 Deposition of the Hybrid Gate Insulator Layer ("the Gate Dielectric")

The hybrid is deposited by plasma-enhanced chemical vapor deposition (PE-CVD) in a single-chamber reactor, denoted below as the "small PE-CVD." In the course of development of the hybrid material, the small PE-CVD was re-configured several times. The hybrid gate dielectric was deposited in two configurations, which differ in electrode surface area and gas feed as explained below.

PE-CVD of the hybrid dielectric under oxygen-rich conditions (i.e., flow rates greater than about 25:1 relative to the flow of hexamethydidsiloxame) was found to produce a material with a dielectric breakdown field $E_{bd} \cong 8$ MV/cm, close to that of thermal $SiO_2$. (See FIG. 13.)

1.1 PECVD Configuration

102 $cm^2$ surface area of the powered electrode and of the grid over the gas feed plenum.

Source gas flow rates: Oxygen 42 sccm; hexamethyldisiloxane (HMDSO) 1.17 sccm; RF frequency: 13.56 MHz; RF power used for deposition: 50 W (0.5 W/$cm^2$); deposition pressure: ~120 mtorr=16 Pa;

Substrate temperature: nominal room temperature.

1.2 Alternative PECVD Configuration

182 $cm^2$ surface area of powered electrode, and 7.5 cm diameter of the gas feed ring.

Source gas flow rates: $O_2$ 33 sccm; HMDSO 1.25 sccm; RF frequency: 13.56 MHz; deposition power: 70 W (0.38 W/$cm^2$); deposition pressure: ~115 mtorr=15 Pa Substrate temperature: nominal room temperature to 310° C.

2.0 Thin-Film Transistor (TFT) Fabrication Process Sequences

The process sequences for two different TFT geometries are described below. Both use amorphous hydrogenated silicon (a-Si:H or a-Si) for the channel semiconductor. The first is the conventional inverted-staggered geometry, which was made on glass and on Kapton™ polyimide foil substrates; the second is the top-gate staggered geometry.

The examples herein were carried out using two PE-CVD apparatuses. One is the "small PE-CVD" described above, which is used for deposition of the organosilicate glass (OSG) gate dielectric, back channel passivation, and substrate passivation layers. The other is a four-chamber PE-CVD system, in which all other TFT layers are deposited: silicon nitride ($SiN_x$) used as passivation layer (and as gate dielectric in conventional a-Si TFTs); undoped amorphous hydrogenated silicon (a-Si:H or a-Si) for the semiconducting channel of the TFT; and a highly-doped n-type a-Si:H layer used for source and drain contacts.

Working with two different PE-CVD apparatuses requires that the samples be transferred forth and back through the atmosphere, which in thin-film electronics is considered to be very undesirable. The reason is that exposure to the atmosphere changes the exposed surfaces (which become interfaces after the subsequent layer has been deposited) in an irreproducible fashion. The most sensitive interface is that between the gate insulator and the semiconductor channel, in this case between the organosilicate glass and the a-Si:H, because conducting electrons move along this interface. Conducting the process in two different PE-CVD systems exposes this interface to the atmosphere, and it is surprising that high field-effect mobilities can be obtained with this process. It is possible that the variations in field-effect mobility between separate TFT process runs are due to a poorly-reproducible interface resulting from the transfer between chambers.

Described below are processes for fabricating inverted-staggered TFTs on glass (2.1) and Kapton polyimide foil (2.2) substrates. In the drawings, the OSG layer may also be designated as "Hybrid."

2.1 Inverted-Staggered Geometry on Glass

Figure 15A:
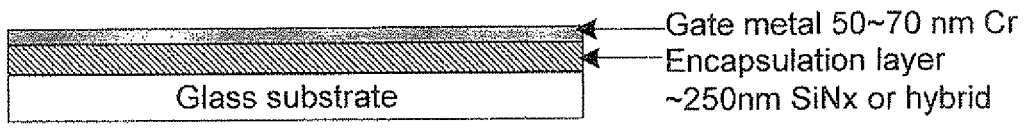
FIG. 15 shows an example of how an inverted-staggered TFT on a glass substrate may be made.
Figure 15B:

The glass substrate was coated with about 250 nm $SiN_x$ in the four-chamber PECVD at 150° C. or 200° C., or with about 250 nm OSG in the small PECVD at room temperature. Then 50 to 70 nm of Cr gate contact metal was thermally evaporated. (See FIG. 15A). Mask #1: Gate patterning. Spin on and pre-bake photoresist, expose resist to UV light through a photomask with the gate metal pattern, develop the resist, wet etch the chromium with chromium etchant, strip the remaining photoresist. (See FIG. 15B.)

Figure 15C:
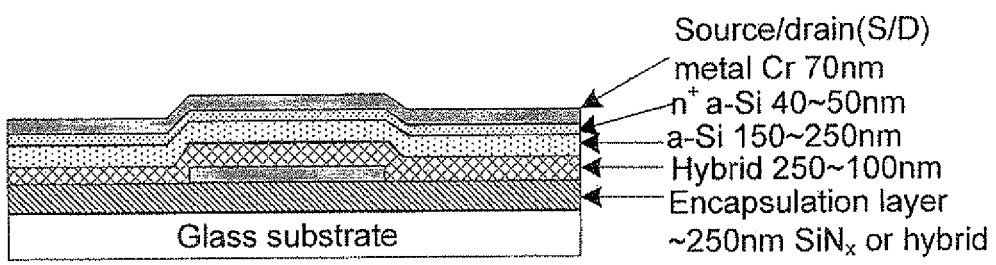

The sample was loaded in the small PECVD, and about 100-250 nm OSG was deposited (sometimes followed by 3 minutes oxygen plasma). Then the sample was transferred to the four-chamber PECVD for the deposition of undoped a-Si:H and $n^+$ a-Si:H at 150° C. or ~250° C. Prior to the deposition of the a-Si:H, Ar plasma was run for 3 minutes to clean the surface. Then ~70 nm Cr for source and drain metal contact was deposited in the thermal evaporator. (See FIG. 15C.)

Figure 15D:
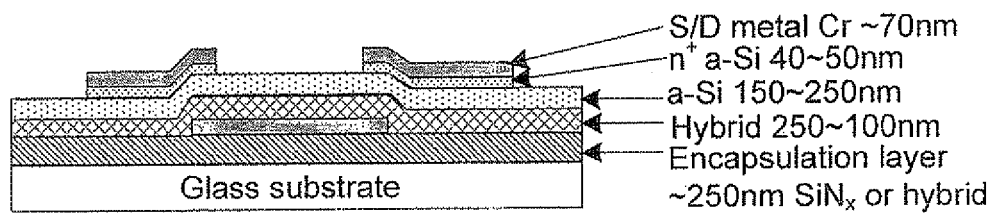

Mask #2: Source and drain (S/D) patterning. Photolithography was as described under Mask #1. Chromium was wet etched with Cr etchant, and $n^+$ a-Si was removed by reactive ion etching (RIE). (See FIG. 15D). Mask #3: Active area (a-Si island) patterning. Photolithography was as described under Mask #1. The a-Si was removed by RIE. Mask #4: Make via openings in the hybrid for gate electrode contact. Photolithography was as described under Mask #1. The OSG was etched with RIE.

2.2 Inverted-Staggered Geometry on 50-μm Thick Kapton™ E Polyimide Foil

Figure 16A:
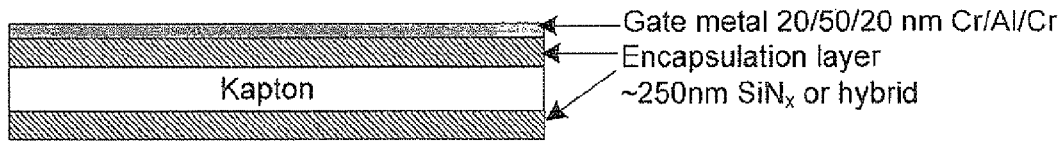
FIG. 16 shows an example of how an inverted-staggered TFT on a flexible polyimide substrate may be made.

A Kapton™ polyimide foil substrate was coated with about 250 nm $SiN_x$ in the four-chamber PECVD at 150° C. or 200° C., or with about 250 nm OSG in the small PECVD at room temperature. Then 20/50/20 nm tri-layer Cr/Al/Cr gate contact metal was thermally evaporated. (See FIG. 16a.)

Figure 16B:
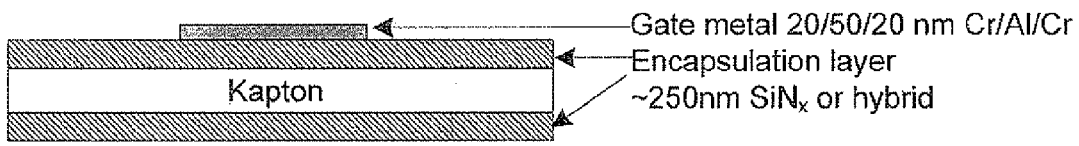

Mask #1: gate patterning. Spin on and pre-bake photoresist, expose resist to UV light through a photomask with the gate metal pattern, develop the resist, wet etch the Cr/Al/Cr with Cr and Al etchants, strip the remaining photoresist. (See FIG. 16B.)

Figure 16C:
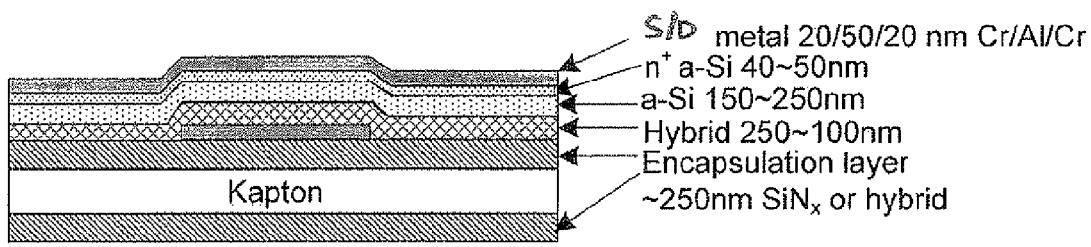

The sample was loaded in the small PECVD, and about 100-250 nm OSG was deposited (sometimes followed by 3 minutes oxygen plasma). Then the sample was transferred to the four-chamber PECVD for the deposition of a-Si and n+ a-Si at 150° C. or ~250° C. Before the deposition of a-Si, 3 minutes of Ar plasma was run to clean the surface. Then 20/50/20 nm Cr/Al/Cr for source and drain metal contact was deposited in the thermal evaporator. (See FIG. 16C.)

Figure 16D:
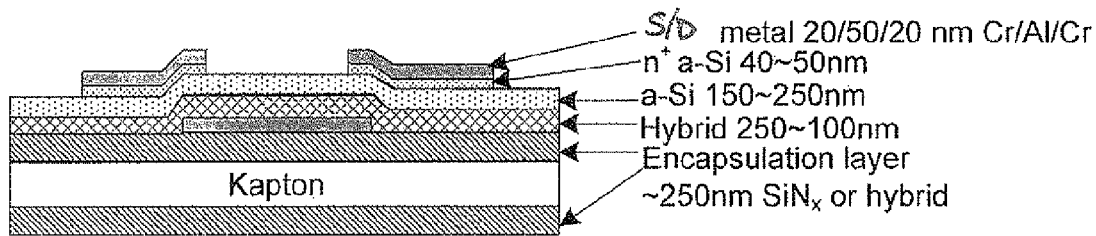
Figure 16E:
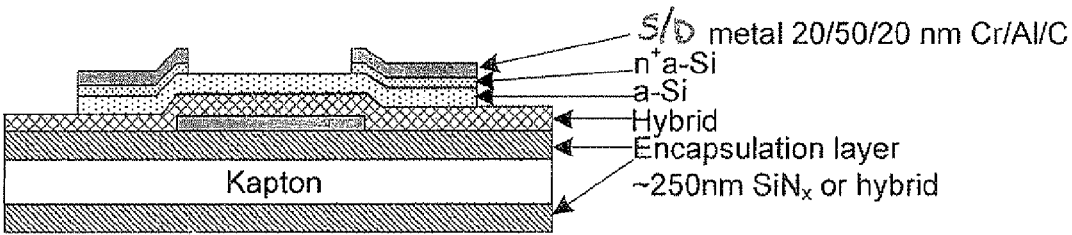

Mask #2: Source and drain (S/D) patterning. Photolithography was as described under Mask #1. Cr and Al were wet etched with Cr and Al etchants, and n⁺ a-Si was removed by reactive ion etching (RIE). (See FIG. 16D.) Mask #3: Active area (a-Si island) patterning. Photolithography was as described under Mask #1. The a-Si was removed by RIE. (See FIG. 16E). Mask #4: Make via openings in the hybrid for gate electrode contact. Photolithography was as described under Mask #1. The OSG was etched with RIE.

2.3 Top-Gate Staggered Geometry on Glass

Figure 17A:
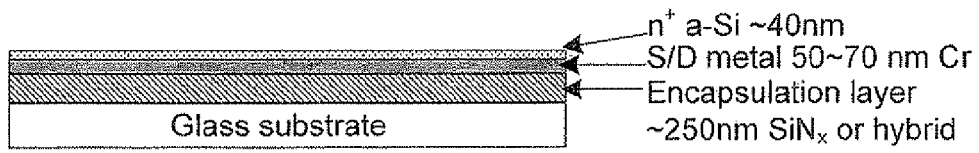
FIG. 17 shows an example of how a top-gate staggered TFT on glass may be made.

A glass substrate was coated with about 250 nm $SiN_x$ in the four-chamber PECVD at 150° C. or 200° C., or with about 250 nm hybrid in the small PECVD at room temperature. Then 50 to 70 nm of Cr source and drain contact metal was thermally evaporated. After transfer to the four-chamber PECVD, approximately 40 nm of n⁺ a-Si for source and drain layer was deposited. (See FIG. 17a.)

Figure 17B:
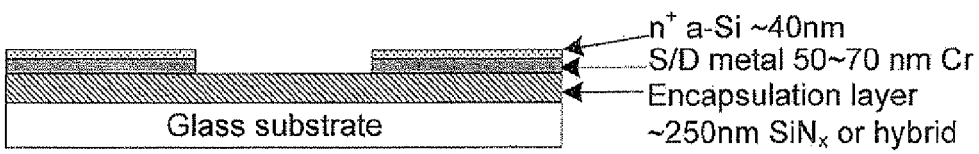

Mask #1: Source and drain (S/D) patterning. Photolithography was as described under Mask #1 of Section 2.1 above. The n⁺ a-Si was etched by reactive ion etching (RIE), and the chromium was wet etched with Cr etchant. (See FIG. 17B.)

Figure 17C:
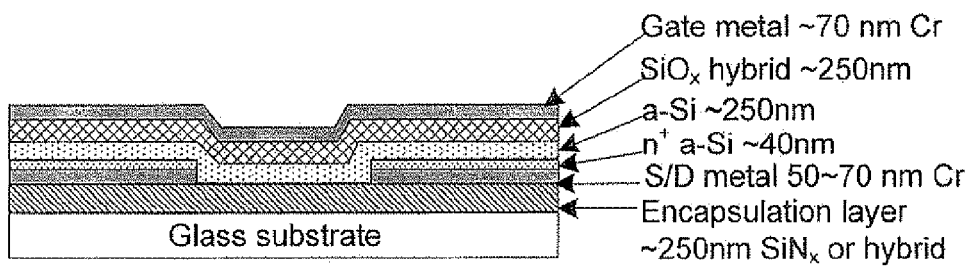

A 250-nm layer of a-Si was deposited in the four-chamber PECVD. A 250 nm OSG layer for the gate dielectric was then deposited in the single-chamber PECVD. Finally 70 nm of Cr was thermally evaporated for the gate electrode. (See FIG. 17C.)

Figure 17D:
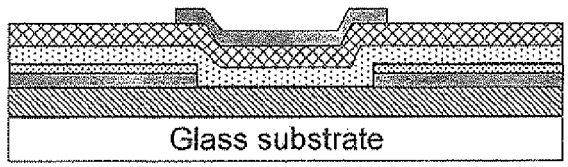
Figure 17E:
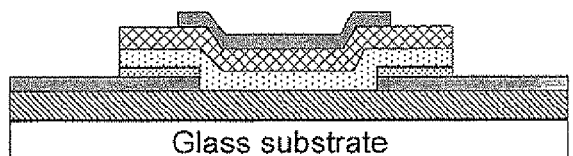

Mask #2: gate patterning. Spun on and pre-baked photoresist, exposed resist to UV light through a photomask with the gate metal pattern, developed the resist, wet etched the Cr with Cr etchant, stripped the remaining photoresist. (See FIG. 17D.) Mask #3: Active area (a-Si island) patterning. Photolithography was as described under Mask #1. The OSG and a-Si were removed by RIE. (See FIG. 17E.)

2.4 Inverted-Staggered Geometry on Glass, with Back Channel Passivation

The glass substrate was coated with about 250 nm $SiN_x$ in the four-chamber PECVD at 150° C. or 200° C., followed by thermal evaporation of a 60 nm layer of Cr metal as gate contact.

Mask #1: Gate patterning. Spin on and pre-bake photoresist, expose resist to UV light through a photomask with the gate metal pattern, develop the resist, wet etch the chromium with chromium etchant, strip the remaining photoresist.

The sample was loaded in the small PECVD, and a 100 nm layer of OSG was deposited. The sample was transferred to the four-chamber PECVD for the deposition of 150 nm of a-Si:H at 250° C., then returned to the small PECVD, and a 150 nm layer of OSG was deposited. Using Mask #2, the 150 nm OSG layer is then patterned to form the back-channel passivation layer.

The sample was dipped into 1/100 diluted buffered oxide etch (BOE), an HF based aqueous etchant, for 20 seconds to remove any oxide, then immediately loaded into the four-chamber PECVD. A 40-nm layer of n⁺-doped a-Si:H was then deposited at 250° C. to provide the source/drain layer. (A 3-minute long Ar plasma may be used to clean the sample surface prior to the deposition of n+ a-Si). Source and drain contacts were provided by a Cr/Al/Cr sandwich (20/200/20 nm), deposited by sequential thermal evaporation of the metals.

Mask #3: Source and drain (S/D) patterning. Photolithography was as described above under Mask #1. Cr/Al/Cr was wet etched with Cr and Al etchants. Mask #4: Active area (a-Si island) patterning. Photolithography was as described under Mask #1. The a-Si was removed by RIE to isolate source and drain, as described above. Mask #5: Via openings were made in the hybrid for gate electrode contact. Photolithography was as described under Mask #1. OSG and a-Si:H were etched with RIE.

3. Transistor Fabrication and Evaluation

Figure 10:
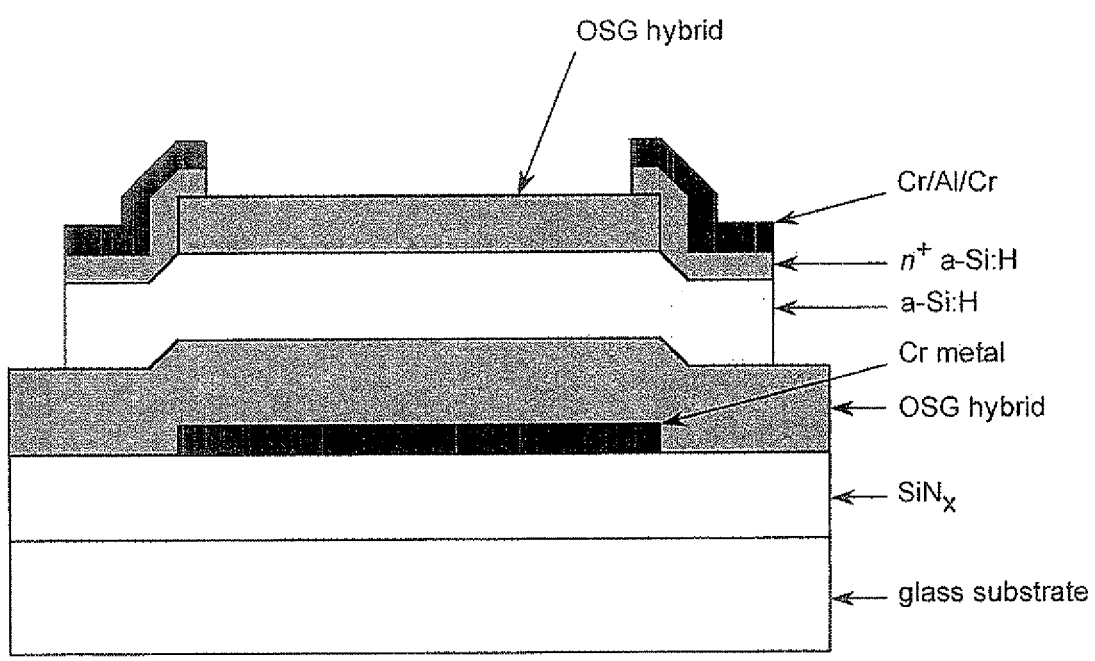
FIG. 10 is a schematic cross-sectional view of an a-Si:H TFT according to an embodiment of the invention, with a 100-nm hybrid dielectric gate insulator, a 150-nm a-Si:H channel, and 150-nm hybrid dielectric passivation layer between the channel and the source/drain.

Using the methods described above, a-Si: H TFTs were prepared, mostly in the conventional inverted-staggered geometry on glass substrates. The cross-sectional view of this geometry is shown in FIGS. 1 and 10. Fabrication, evaluation, and characteristics of representative examples are described below. These samples are designated as TFT 1, TFT 2, TFT 3, and TFT 4. A series of TFTs was also fabricated on polyimide foil for stress and flexibility testing, and TFTs with the OSG gate dielectric in the top-gate co-planar geometry were fabricated as a demonstration of the generality of the invention. The examples illustrate some of the variations in process temperatures, substrates, geometry, and thickness of gate insulator, the use of the hybrid material for gate dielectric, back channel passivation, and substrate passivation, and show the improved electrical and physical properties that can be obtained.

TFT 1 was processed at low temperature and had a 250-nm thick OSG gate insulator, which is close to the thickness of 300 nm of the conventionally-used $SiN_x$ insulator. TFT 2 was processed at high temperature and had a 100-nm OSG insulator, which is extremely thin by the standards of the conventionally-used $SiN_x$ insulators. TFT 3 was processed at low temperature, had a 100-nm (thin) OSG gate insulator, and featured a 150-nm thick OSG back channel passivating layer. TFT 4 was processed at low temperature, and featured a flexible substrate with a hybrid OSG passivation layer, a hybrid OSG gate insulator, and a hybrid OSG back channel passivation layer.

For the fabrication of TFT 1 the glass substrate was coated prior to TFT growth with a 300-nm thick layer of $SiN_x$, deposited by PE-CVD at 150° C. 70 nm of Cr was evaporated as gate electrode. After the gate electrode was patterned, in the specific example of FIG. 1, a 250-nm thick OSG layer was deposited at nominal room temperature in a single-chamber PE-CVD machine. The source gases for $SiO_2$-silicone hybrid OSG deposition were HMDSO and oxygen, which are environmentally friendly and low-cost. The properties of the OSG material fall between those of thermal oxide and plasma-polymerized HMDSO. (L. Han, P. Mandlik, J. Gartside, and S. Wagner, *Mater. Res. Soc. Symp. Proc.*, 2008, A18.3.) The sample was transferred to a four-chamber PE-CVD system to deposit a 300-nm thick a-Si:H channel layer and a 50-nm n⁺ a-Si: H source/drain contact layer. The source/drain contacts (70 nm Cr) were made by thermal evaporation.

Figure 6:
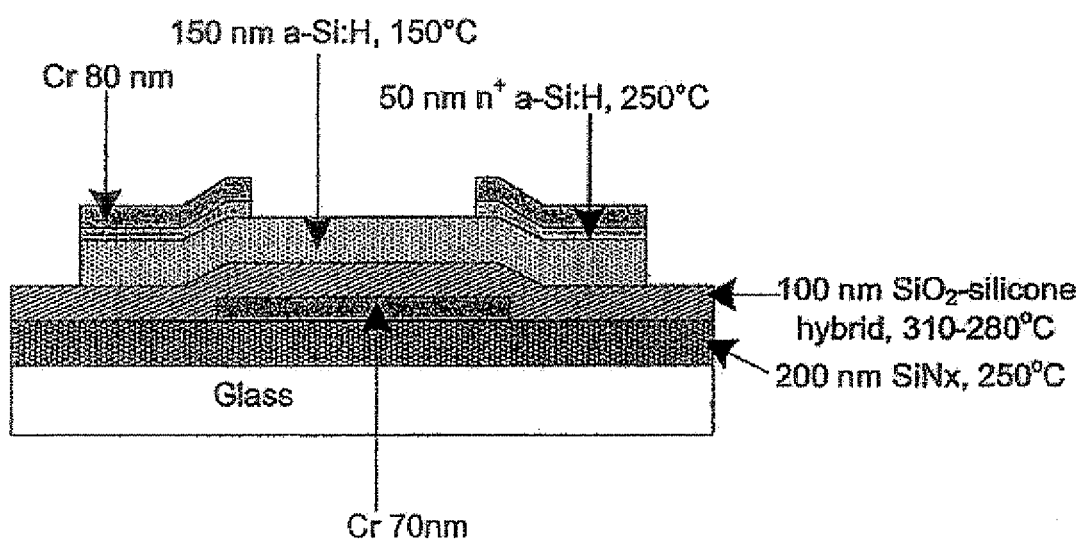
FIG. 6 is a schematic cross-sectional view of an a-Si:H TFT according to an embodiment of the invention, with a 100-nm hybrid dielectric gate insulator deposited at a temperature of about 300° C.

For the fabrication of TFT 2 (FIG. 6), the glass substrate was coated prior to TFT growth with a 200 nm thick layer of $SiN_x$, deposited by PE-CVD at 250° C. A 70 nm layer of Cr was evaporated as gate electrode. After the gate electrode was patterned, a 100-nm thick OSG layer was deposited at a substrate temperature of 310° C. to 280° C. in a single-chamber PE-CVD machine. The sample was then transferred to a four-chamber PE-CVD system to deposit a 150-nm thick a-Si:H channel layer and a 50-nm n⁺ a-Si: H source/drain contact layer. The source/drain contacts were made of thermally evaporated 70 nm Cr.

For the fabrication of TFT 3 (FIG. 10), the glass substrate was coated prior to TFT growth with a 250 nm thick layer of $SiN_x$, deposited by PE-CVD at 250° C. A 70 nm layer of Cr was evaporated as gate electrode. After the gate electrode was patterned, an approximately 100-nm thick OSG layer was deposited at room temperature in a single-chamber PE-CVD machine. The sample was then transferred to a four-chamber PE-CVD system to deposit a 150-nm thick a-Si:H channel layer. A 150 nm OSG layer was then laid down, again at room temperature, followed by the patterning of the back-channel passivation layer. Then the sample was dipped into 1/100 diluted BOE for 20 seconds to remove any native oxide, and transferred immediately to the four-chamber PECVD system for deposition of 40-nm n+ a-Si:H source/drain layer. The source/drain contacts, a Cr/Al/Cr (20/200/20 nm) sandwich, were applied by thermal evaporation. Patterning of source and drain, isolation of islands, and opening of vias to gate electrodes, were carried out by etching in the usual manner.

For the fabrication of TFT 4, a 50 μm polyimide foil substrate was encapsulated by room-temperature PE-CVD deposition of a 250 nm layer of OSG hybrid on both faces. A Cr/Al/Cr (15/40/15 nm) metal sandwich was thermally evaporated and patterned for gate electrodes. A 150-nm thick OSG hybrid gate dielectric was deposited at room temperature by PE-CVD, followed by a 150 nm layer of a-Si:H deposited at 150° C. A 150-nm thick OSG hybrid layer was then deposited for back-channel passivation. After patterning, a 40 nm n+ a-Si:H source/drain layer was deposited at 150° C., followed by thermal evaporation of a 15/40/15 nm Cr/Al/Cr sandwich for source/drain contacts. Source and drain were patterned, a-Si:H islands were separated, and vias to gate electrodes were opened by etching.

a-Si:H TFTs with the OSG gate dielectric in the top-gate co-planar geometry were also fabricated. These TFTs are not described further in the present disclosure, but they were functional as well, and may enable introduction of the top-gate geometry to industrial use.

The TFTs were evaluated for their $I_{DS}$–$V_{DS}$ output characteristics, their $I_{DS}$–$V_{GS}$ transfer characteristics, and their gate-bias-stress stability, with an HP4155A parameter analyzer. For the output characteristics, the source drain voltage was swept from 0 V to 20 V, and the gate voltage was swept from 10 to 22 V in steps of 2 V. For transfer characteristics, the gate voltage was swept from 20 to –10 V at a drain-source bias of 10 V and 0.1 V. During gate-bias stressing the source and drain were grounded, and a positive voltage was applied to the gate for 600 s. Then the transfer characteristic was measured again by sweeping the gate voltage from 20 to –10V. The gate-bias voltages was varied from 5 V to 80 V, which means that electric field across the gate insulator was varied from 0.2 to 3.2 MV/cm. The shift in the threshold voltage was determined on the subthreshold slope of the transfer curves, at the drain-current value of $1\times10^{-10}$ A.

4. Results

TFT 1.

Figure 2:
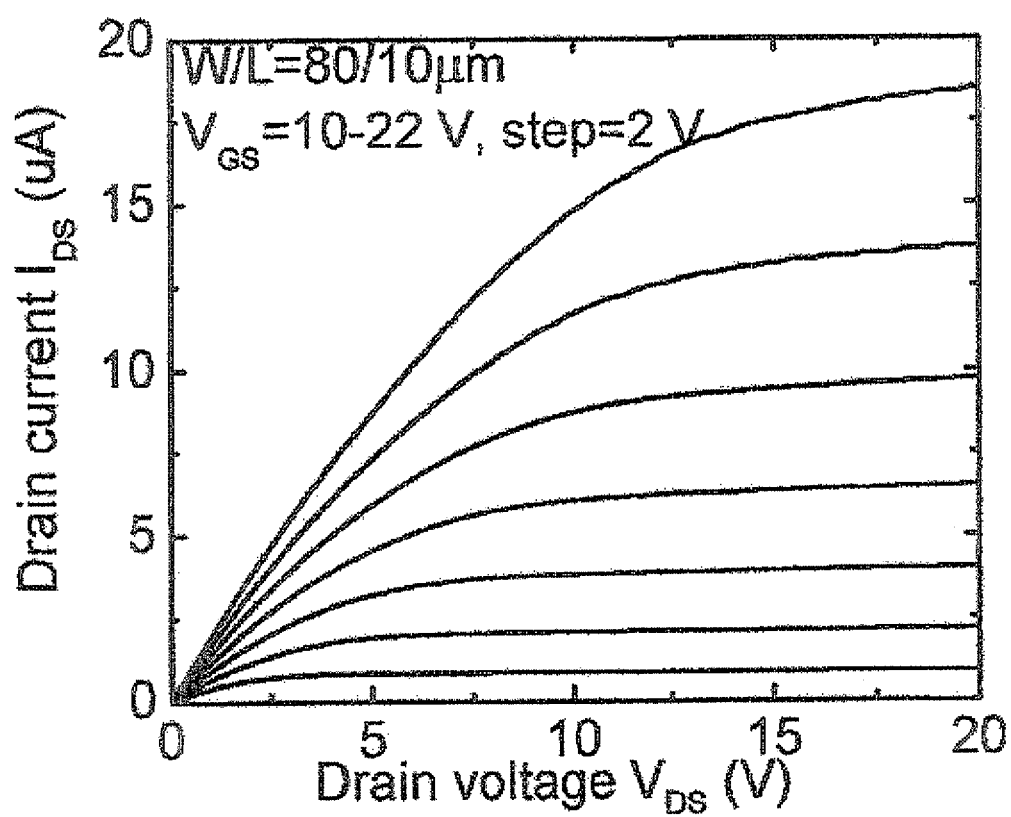
FIG. 2 shows the output characteristics of the TFT of FIG. 1.
Figure 3:
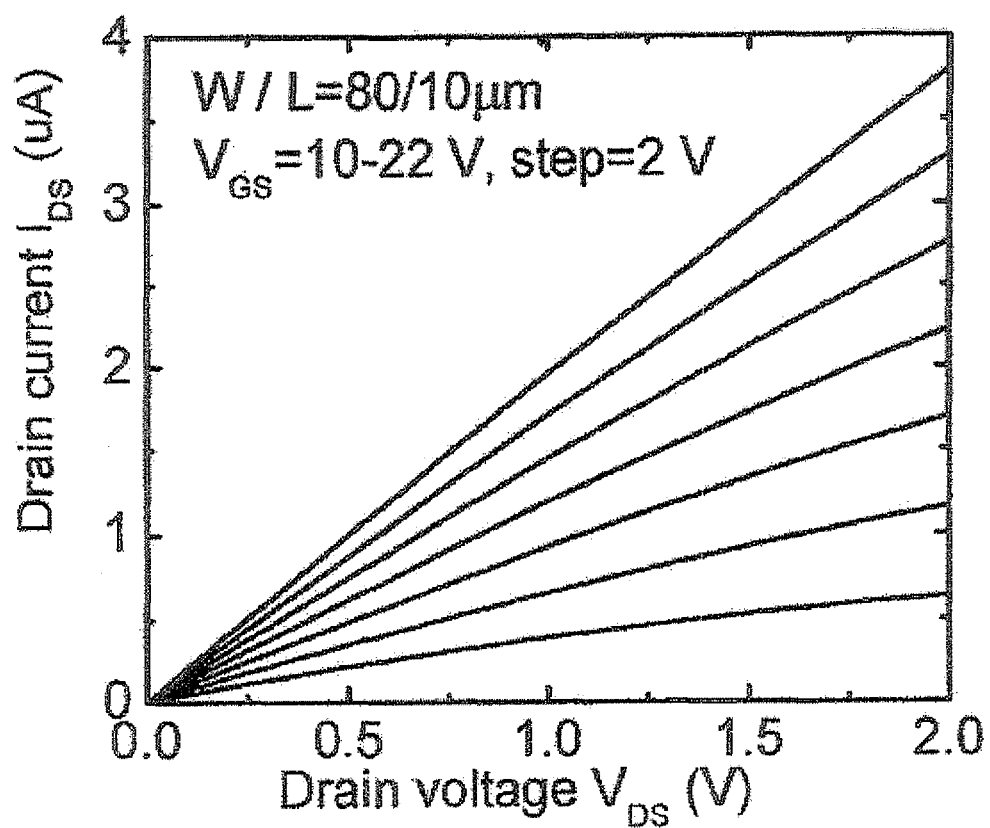
FIG. 3 shows the output characteristics in the linear regime of the TFT of FIG. 1.
Figure 4:
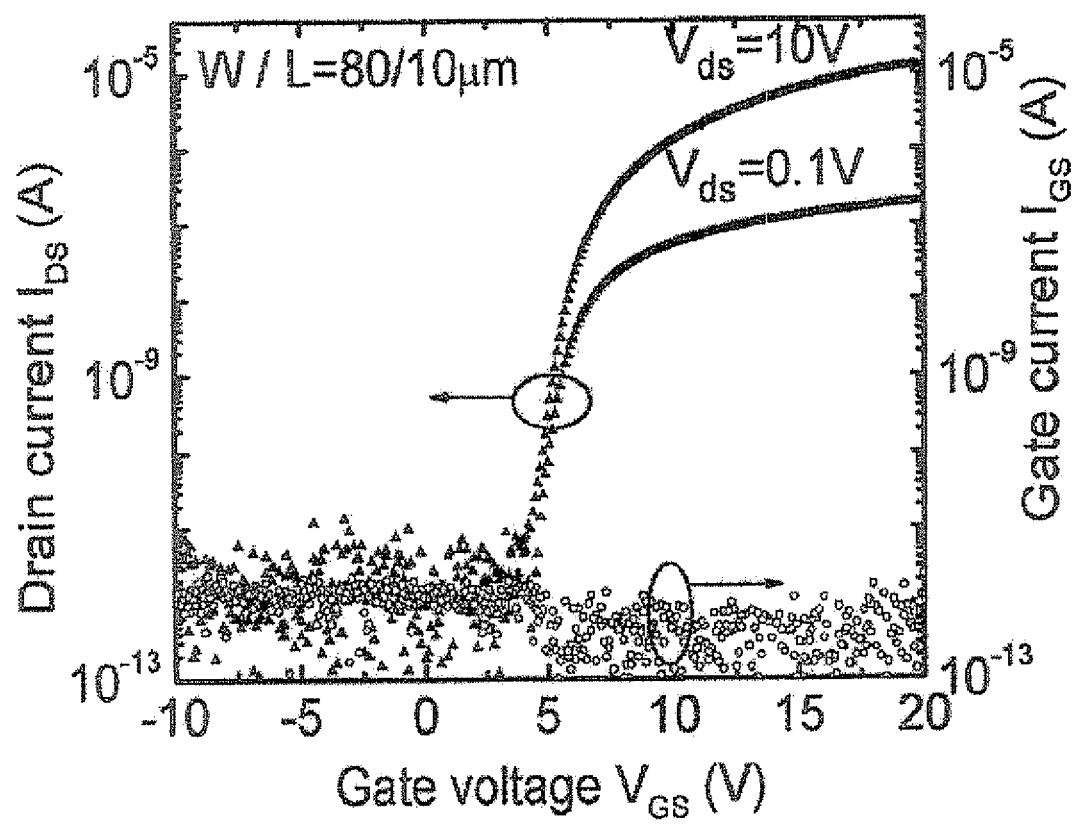
FIG. 4 shows the transfer characteristics and gate leakage current of the TFT of FIG. 1.

FIG. 2 shows the $I_{DS}$–$V_{DS}$ characteristics of TFT 1 with channel width and channel length of 80 μm and 10 μm, respectively. The linear region is enlarged and shown in FIG. 3. The transfer characteristics are shown in FIG. 4. An electron field-effect mobility of 1.11 $cm^2/V \cdot s$ in the linear region is extracted from the slope of drain current versus gate voltage, the ratio of gate width W to gate length L, the gate capacitance C and the drain-source bias voltage of 0.1 V. The saturation mobility of 1.12 $cm^2/V \cdot s$ is derived from the slope of square root of the drain current versus gate voltage, W/L ratio, and gate capacitance. The threshold voltage is ~5 V, the on/off current ratio is over $10^7$, and the subthreshold slope is 500 mV/decade.

Figure 5:
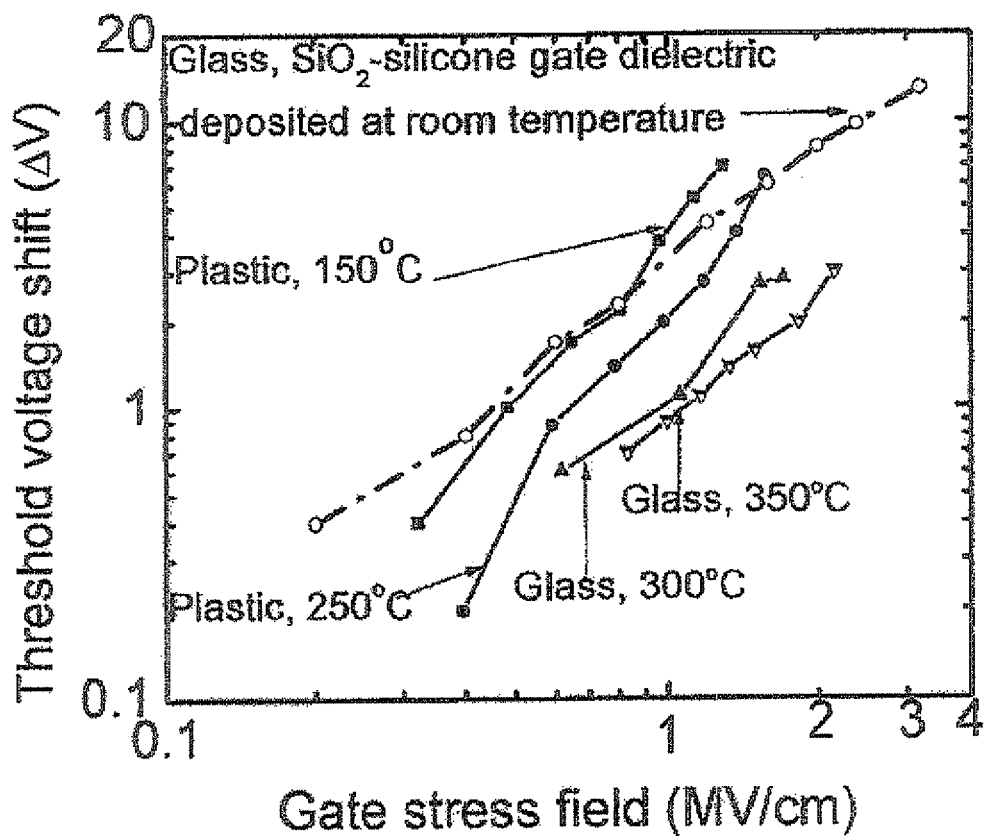
FIG. 5 shows the threshold-voltage shift versus gate-bias field for the TFT of FIG. 1 with the hybrid gate dielectric, and of TFTs with a conventional $SiN_x$ gate dielectric fabricated at 150° C., 250° C., 300° C., and 350° C., on glass or plastic substrates.

The threshold-voltage shifts after gate-bias stressing are shown in FIG. 5, together with literature data of other TFTs with $SiN_x$-gate dielectrics deposited over a range of substrate temperatures. (K. Long, et al., *IEEE Electron Device Lett.*, 27:111-113, 2006; K. H. Cherenack, et al., *IEEE Electron Device Lett.*, 28:1004-1006, 2007; F. R. Libsch and J. Kanicki, *Appl. Phys. Lett.*, 62:1286-1288, 1993).

The literature teaches that the threshold-voltage stability of a-Si:H TFTs using $SiN_x$ gate dielectrics improves as the process temperature is raised. For TFT 1, although the $SiO_2$-silicone hybrid gate dielectric was deposited at nominal room temperature, the stability of TFT 1 was comparable to that of other TFTs using conventional $SiN_x$ for the gate dielectric fabricated at 150° C. on plastic. Moreover, at higher gate-bias stressing, the stability of TFT 1 exceeds that of the TFT using conventional $SiN_x$ for the gate dielectric fabricated at 150° C. In more recently obtained data, TFTs made according to the present invention had threshold-voltage stabilities that exceed even TFTs using $SiN_x$-gate dielectrics fabricated at 350° C. (Data not shown here, but see Lin Han et al., "A New Gate Dielectric for Highly Stable Amorphous-Silicon Thin-Film Transistors With ~1.5-$cm^2/V \cdot s$ Electron Field-Effect Mobility," IEEE Electron Device Lett. 30:5, pp. 502-504 (May 2009), which is incorporated by reference herein.)

TFT 2.

Figure 7:
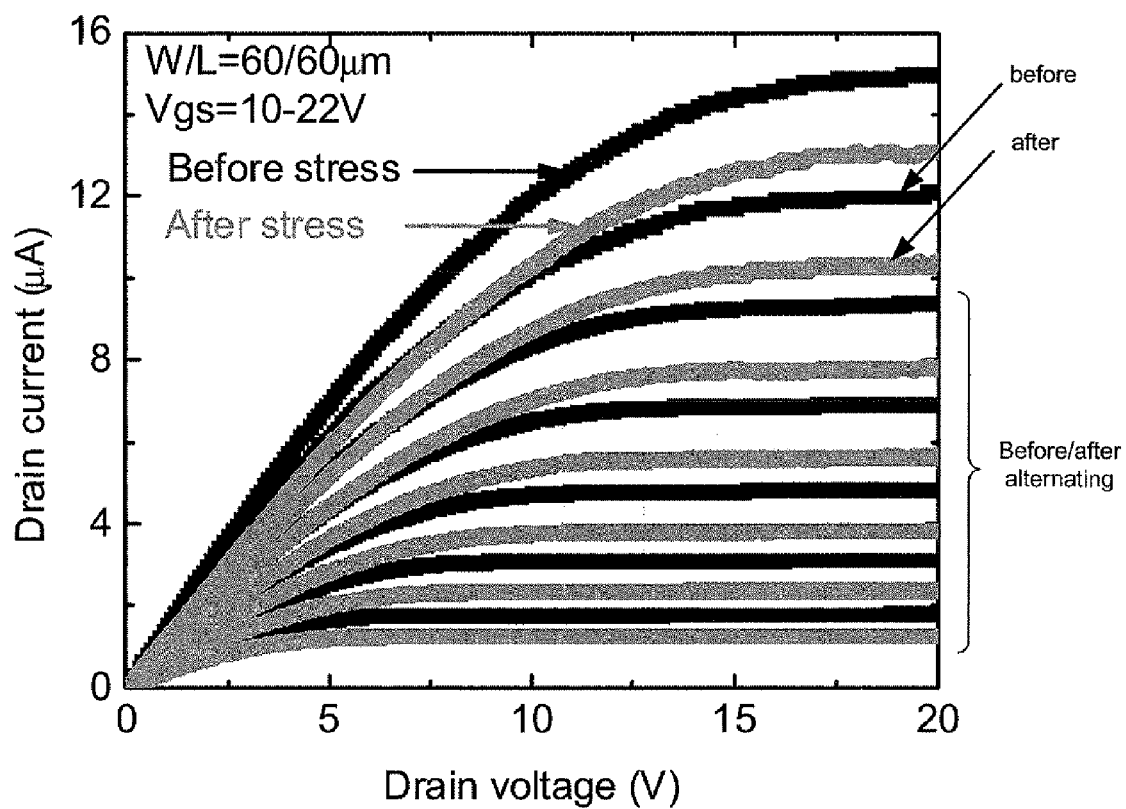
FIG. 7 shows the output characteristics of the TFT of FIG. 6, before and after gate-bias stressing.
Figure 8:
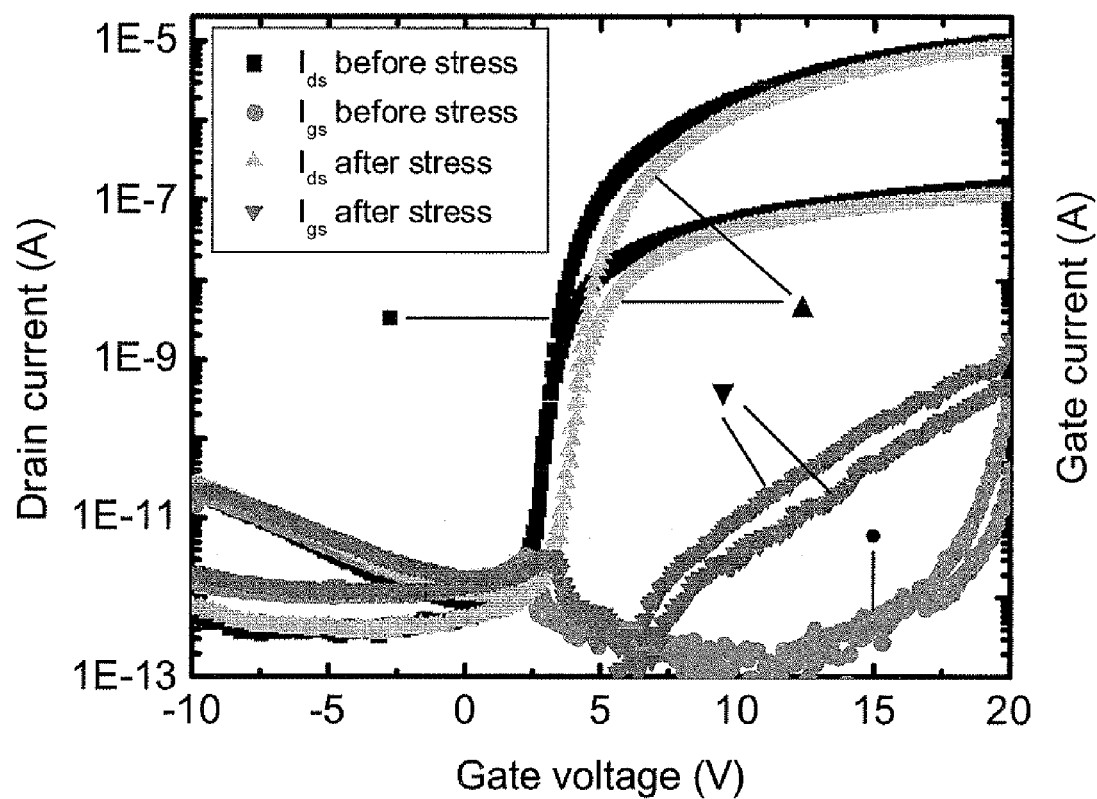
FIG. 8 shows the transfer characteristics and gate leakage current of the TFT of FIG. 6, before and after gate-bias stressing.

FIG. 7 shows the $I_{DS}$–$V_{DS}$ characteristics of TFT 2 with channel width of 60 μm and channel length of 60 μm. The characteristics are shown before and after bias stressing. The transfer characteristics and gate leakage current before and after bias stressing are shown in FIG. 8. This TFT had a threshold voltage of 2.9 V; and electron field-effect mobility of 2.37 $cm^2/V \cdot s$ in the linear regime and 2.29 $cm^2/V \cdot s$ in the saturated regime.

Figure 9:
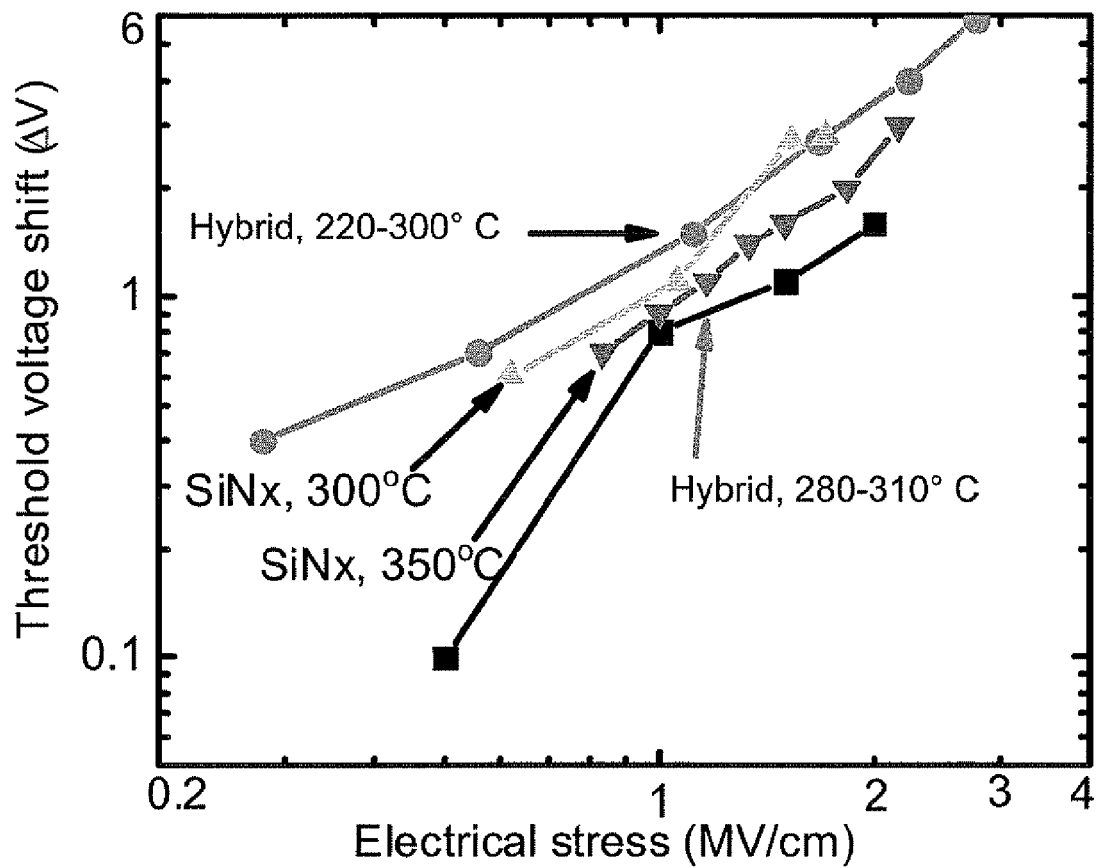
FIG. 9 shows the threshold-voltage shift versus gate-bias field for the TFT of FIG. 6, and of TFTs with a conventional $SiN_x$ gate dielectric fabricated at 300° C. and 350° C.

The threshold-voltage shifts after gate-bias stressing of TFT 2 are shown in FIG. 9, again together with literature data of other TFTs with $SiN_x$-gate dielectrics deposited over a range of substrate temperatures. The data suggest that the threshold-voltage shift of TFT 2 was about half that of a conventional a-Si:H TFT with the $SiN_x$-gate dielectric deposited at the same or similar temperatures as the hybrid dielectric of TFT 2. A comparison of some of the basic electrical properties of the hybrid $SiO_2$-silicone dielectric and $SiN_x$ dielectrics is shown in Table 1 below. Note that the hybrid $SiO_2$-silicone dielectric has a higher capacitance than the $SiN_x$ dielectric material.

TABLE 1

Properties of $SiO_2$-silicone hybrid dielectric and of conventional $SiN_x$ gate dielectric for a-Si:H TFTs.

|  | Hybrid | $SiN_x$ |
|---|---|---|
| Insulator thickness (nm) | 100 | 300 |
| Relative dielectric constant | 4.0 | 7.6 |
| Specific capacitance (F/$cm^2$) | $3.5 \times 10^{-8}$ | $2.2 \times 10^{-8}$ |
| Subthreshold slope (mV/decade) | 270 | 500 |
| Dielectric breakdown field $E_{bd}$ (MV/cm) | ~8 | ~5 |

TFT 3.

Figure 11:
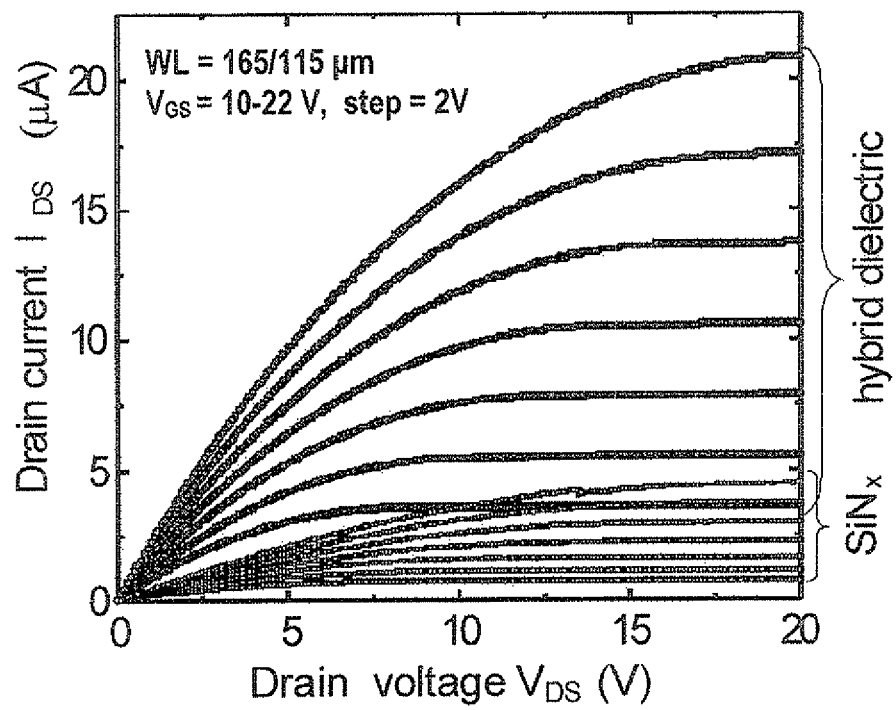
FIG. 11 shows the output characteristics of the TFT of FIG. 10.
Figure 12:
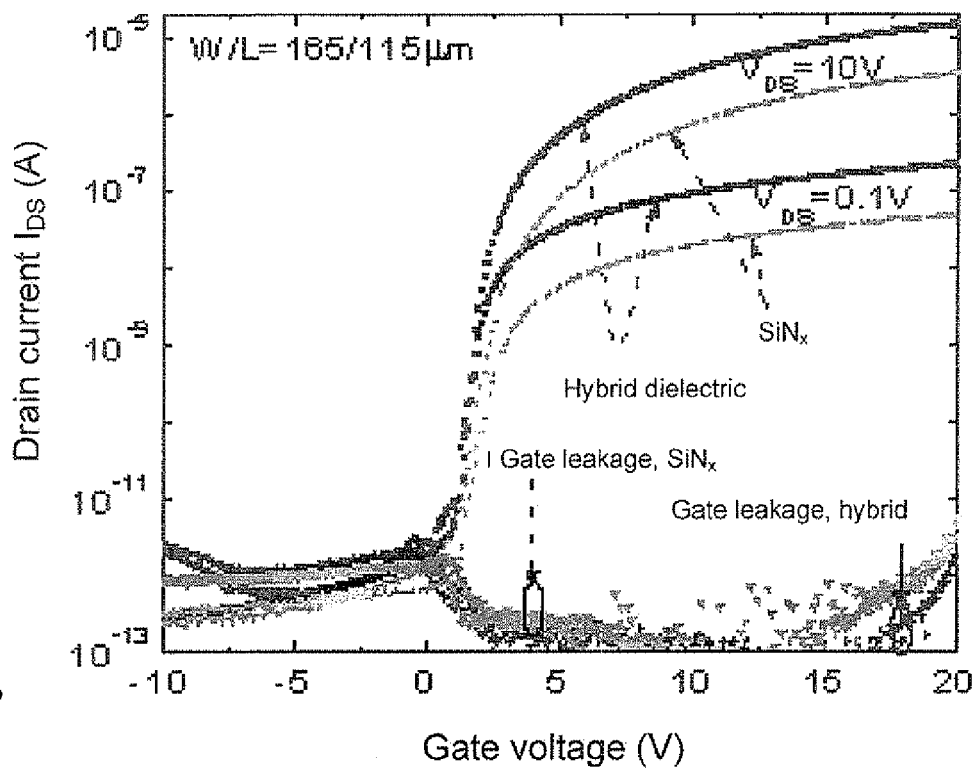
FIG. 12 shows the transfer characteristics and gate leakage current of the TFT of FIG. 10.

FIGS. 11 and 12 compare the characteristics of TFT 3 with a hybrid dielectric to the characteristics of a conventional TFT manufactured with $SiN_x$ as the gate dielectric. Dimensions and measurement conditions are identical except for the gate dielectric and back channel layers. Output ($I_{DS}$–$V_{DS}$) characteristics plotted in FIG. 11 show that the "hybrid" TFT produces ~4× the current of the "SiN$_x$" TFT. The DC transfer ($\log_{10}[I_{DS}$-$V_{GS}]$) characteristics of FIG. 12 show that OFF and gate leakage currents of ~1 pA are similar for both TFTs, a higher ON current and ON/OFF ratio for the "hybrid" TFT, and a subthreshold slope of 270 mV/dec for the "hybrid" vs. 500 mV/dec for the "SiN$_x$" TFT. The least-squares fits of FIG. 4 to the saturated ($V_{DS}$=10V) and linear regimes ($V_{DS}$=0.1V) of the "hybrid" TFT yield $\mu_{n,sat}$=2.0 cm$^2$/V·s and =2.1 cm$^2$/V·s, and $V_T$=2.0 and 2.5 V, respectively.

TFT 4.

These TFTs adhered well to the foil substrate (see below), and were found to have an electron field-effect mobility of 1.2 cm$^2$/V s, subthreshold slope of 300 mV/decade, ON/OFF ratio of 10$^7$, and leakage current of 10$^{-12}$ A.

Flexibility of TFTs Built on Hybrid OSG-Passivated Polyimide.

The resilient SiO$_2$-silicone hybrid material was used to passivate a 50 µm-thick polyimide substrate foil prior to TFT fabrication (see section 2.2 above.) Substrates were passivated with approximately 300-nm thick layers of the hybrid material on both faces of the substrate or only on the TFT side of the substrate. Adhesion of the hybrid passivation layers to the polyimide substrate may optionally be improved, by depositing approximately 10 nm thick SiN$_x$ subbing layers prior to the deposition of the hybrid layers. Individual TFTs built upon passivated polyimide were bent to known radii for one minute and then flattened for measurement of transfer characteristics. The axis of bending was perpendicular to the source-drain current path. This process was repeated until the TFT failed electrically. TFTs made with the hybrid dielectric demonstrated similar flexibility conventional TFTs made with SiN$_x$, when strained in compression, but exhibited significantly increased flexibility when strained in tension.

Under bending to compressive strain, all TFTs tested delaminated from the substrate for compressive strains greater than 2%, regardless of whether the substrate was passivated on both faces or on the TFT side only. Conventional a-Si:H/SiN$_x$ TFTs have been previously found to delaminate at a similar compressive strain. Under bending to tensile strain, TFTs made with the new hybrid material on substrates passivated on both faces did not exhibit significant changes in transfer characteristics under strains of up to ~0.8% and remained functional under strains of up to 1.6%. Conventional a-Si:H/SiN$_x$ TFTs on substrates passivated on both faces have been found to exhibit changes in transfer characteristics at ~0.4% tensile strain and remain functional for strains of up to 0.5%, a value over 3 times less than that for TFTs made with the new hybrid material.

On substrates passivated on the TFT side only, hybrid dielectric TFTs did not exhibit significant changes in transfer characteristics for tensile strains of up to ~2.5%. The performance of conventional a-Si:H/SiN$_x$ TFTs on substrates passivated on the TFT side only deteriorates when strained in tensile to ~0.5%, a value 5 times less than that for TFTs made with the new hybrid material. These results suggest that TFTs made with the new dielectric material have the potential to enhance the flexibility and durability of large area electronics, such as displays and sensors.

The electron field-effect mobilities achieved in the results above are surprisingly high considering that other a-Si:H TFTs using SiN$_x$ gate dielectrics have an electron field-effect mobility of about 1 cm$^2$/V·s. (See, for example, D. Striakhilev et al., J. Display Technol., vol. 2, p. 364 (2006)). One analysis reported that the effective electron field-effect mobility for a high performance a-Si:H TFT reaches 1.2 cm$^2$/V·s in the linear region, 1.5 cm$^2$/V·s in the saturation region, and have an intrinsic mobility of 1.6 cm$^2$/V·s (see J. Kanicki & S. Martin, "Thin-Film Transistors," C. Kagan and P. Andry, eds., p. 108, Marcel Dekker (2003)). Therefore, the electron field-effect mobilities obtained in the above described a-Si:H TFTs are surprisingly high.

The high electron field-effect mobilities in the results above suggest that the interface between the gate insulator layer and the a-Si:H channel has an unusually low density of traps. In certain embodiments, a transistor of the present invention has an effective electron field-effect mobility in the linear region of greater than 1.5 cm$^2$/V·s, and in some cases, greater than 2.0 cm$^2$/V·s. In certain embodiments, a transistor of the present invention has an on/off current ratio of greater than 1×10$^5$, and in some cases, greater than 1×10$^6$, and in some cases, greater than 1×10$^7$. In certain embodiments, a transistor of the present invention has a threshold voltage ($V_{th}$) of less than 4.0 V, and in some cases, less than 2.0 V. In certain embodiments, a transistor of the present invention has a subthreshold slope of less than 500 mV/dec, and in some cases, less than 300 mV/dec. The subthreshold slope characterizes the sharpness of the field-effect onset and is given by $S=dV_{GS}/d(\log I_{DS})$, where $V_{GS}$ is the voltage at the gate, and $I_{DS}$ is the current between the drain and source in the region where the behavior is linear (i.e., $V_{GS}<V_{th}$). Such performance characteristics may be difficult to achieve with SiN$_x$-gate dielectric layers having a thickness of less than 300 nm.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. Each of the disclosed aspects and embodiments of the present invention may be considered individually or in combination with other aspects, embodiments, and variations of the invention. In addition, unless otherwise specified, the steps of the methods of the present invention are not confined to any particular order of performance.

We claim:

1. An electronic device comprising a field-effect transistor, the field-effect transistor comprising:
    a semiconductor active layer comprising a semiconductor material;
    a source electrode and a drain electrode;
    a gate electrode; and
    an insulating material disposed between the gate electrode and the semiconductor active layer, the insulating material consisting essentially of a hybrid silica-silicone material that comprises from 70% to 95% silicon dioxide and 30% to 5% siloxane polymer; and a back channel passivation layer consisting essentially of a hybrid silica-silicone material, the back channel passivation layer in physical contact with the semiconductor active layer.

2. The device of claim 1, wherein the semiconductor material is selected from amorphous silicon, nanocrystalline silicon, microcrystalline silicon, polycrystalline silicon, zinc oxide, zinc tin oxide, or zinc gallium oxide.

3. The device of claim 2, wherein the semiconductor material is amorphous silicon.

4. The device of claim 3, wherein the semiconductor material is hydrogenated amorphous silicon.

5. The device of claim 1, wherein the semiconductor material is an organic semiconductor.

6. The device of claim 1, wherein the insulating material consists of a hybrid silica-silicone material.

7. The device of claim 1, wherein the back channel passivation layer consists of a hybrid silica-silicone material.

8. The device of claim 1, wherein the hybrid silica-silicone material is deposited by plasma-enhanced chemical vapor deposition from a gas mixture comprising one or more volatile silicone precursors and oxygen.

9. The device of claim 8, wherein the gas mixture further comprises one or more volatile sources of nitrogen.

10. The device of claim 9, wherein the volatile silicone precursor is selected from the group consisting of tetramethyldisiloxane, hexamethyldisiloxane, octamethyltrisiloxane, hexamethylcyclotrisiloxane, octamethylcyclotetrasiloxane, decamethylcyclopentasiloxane, and 2,2-dialkyl-1,3-dioxa-2-silacyclopentanes.

11. The device of claim 10, wherein the volatile silicone precursor is hexamethyldisiloxane.

12. The device of claim 1, further comprising a flexible substrate, wherein the field-effect transistor is mounted over the flexible substrate.

13. The device of claim 12, further comprising a subbing or passivation layer disposed between the substrate and the field-effect transistor.

14. The device of claim 13, wherein the subbing or passivation layer consists essentially of a hybrid silica-silicone material.

15. The device of claim 14, wherein the subbing or passivation layer consists of a hybrid silica-silicone material.

16. The device of claim 1, wherein the insulating material forms a gate insulator layer, the gate insulator layer having a thickness of less than 300 nm.

17. The device of claim 16, wherein the gate insulator layer has a thickness of less than 250 nm.

18. The device of claim 1, wherein the transistor has an effective electron field-effect mobility of greater than 1.5 $cm^2/V \cdot s$ in the linear region, an on/off current ratio of greater than $1 \times 10^6$, a threshold voltage of less than 4.0 V, and a subthreshold slope of less than 500 mV/dec.

19. The device of claim 1, wherein the device is a display screen.

20. The device of claim 1, wherein the device is an organic light emitting device.

21. A method of making a field-effect transistor, comprising the steps of:
   providing a substrate;
   forming a gate insulator layer over the substrate by steps comprising:
      (a) placing the substrate in a deposition chamber;
      (b) introducing into the chamber a source gas comprising a volatile organosilicon compound and at least one oxidant gas selected from the group consisting of oxygen, ozone, hydrogen peroxide, and nitrous oxide; and
      (c) applying radio frequency, microwave frequency, or DC power to the chamber;
   wherein the gate insulator layer consists essentially of a hybrid silica-silicone material that comprises from 70% to 95% silicon dioxide and 30% to 5% siloxane polymer; and a back channel passivation layer consisting essentially of a hybrid silica-silicone material, the back channel passivation layer in physical contact with the semiconductor active layer.

22. The device of claim 1, wherein the hybrid silica-silicone material is a homogenous mixture of the silicon dioxide and the siloxane polymer.

* * * * *